United States Patent
Henke et al.

(10) Patent No.: US 11,862,408 B2
(45) Date of Patent: Jan. 2, 2024

(54) POWER CONTACT FAULT CLEARING DEVICE

(71) Applicant: Arc Suppression Technologies, Bloomington, MN (US)

(72) Inventors: Reinhold Henke, Alexandria, MN (US); Robert Thorbus, Chanhassen, MN (US)

(73) Assignee: Arc Suppression Technologies, Bloomington, MN (US)

( * ) Notice: Subject to any disclaimer, the term of this patent is extended or adjusted under 35 U.S.C. 154(b) by 0 days.

(21) Appl. No.: 17/507,025

(22) Filed: Oct. 21, 2021

(65) Prior Publication Data

US 2022/0044882 A1    Feb. 10, 2022

Related U.S. Application Data

(63) Continuation of application No. 16/934,167, filed on Jul. 21, 2020, now Pat. No. 11,195,670, which is a
(Continued)

(51) Int. Cl.
*H01H 1/00* (2006.01)
*H01H 50/04* (2006.01)
(Continued)

(52) U.S. Cl.
CPC ....... *H01H 1/0015* (2013.01); *G01R 31/3277* (2013.01); *G01R 31/3278* (2013.01);
(Continued)

(58) Field of Classification Search
CPC .. H01H 1/0015; H01H 50/045; H01H 1/0007; H01H 47/002; H01H 2047/003;
(Continued)

(56) References Cited

U.S. PATENT DOCUMENTS 4,420,784 A    12/1983   Chen et al.
5,420,571 A    5/1995    Coleman et al.
(Continued)

FOREIGN PATENT DOCUMENTS

DE    4427006    2/1996
DE    19711622.1  7/1998
(Continued)

OTHER PUBLICATIONS

"International Application Serial No. PCT US2020 049807, International Preliminary Report on Patentability dated Mar. 24, 2022", 16 pgs.
(Continued)

*Primary Examiner* — Danny Nguyen
(74) *Attorney, Agent, or Firm* — Schwegman Lundberg & Woessner, P.A.

(57) ABSTRACT

An electrical circuit includes a contact with a pair of switchable electrodes, the contact configured to cycle through make and break transitions while conducting current. The electrical circuit further includes an arc suppressor, at least one sensor, and a controller circuit. The arc suppressor is coupled across the pair of switchable electrodes and is to extinguish an arc formed across the pair of switchable electrodes during the make and break transitions of the contact. The at least one sensor is coupled to the pair of switchable electrodes and is configured to generate sensor data. The controller circuit includes a plurality of registers and is configured to detect a fault condition associated with the contact based on the sensor data. The controller circuit further sequences contact opening of the contact based on the detected fault condition and a timing value stored in at least one register of the plurality of registers.

19 Claims, 5 Drawing Sheets

Related U.S. Application Data continuation of application No. 16/776,112, filed on Jan. 29, 2020, now Pat. No. 10,763,659.

(60) Provisional application No. 62/898,795, filed on Sep. 11, 2019, provisional application No. 62/898,787, filed on Sep. 11, 2019, provisional application No. 62/898,780, filed on Sep. 11, 2019, provisional application No. 62/898,783, filed on Sep. 11, 2019, provisional application No. 62/898,798, filed on Sep. 11, 2019, provisional application No. 62/798,316, filed on Jan. 29, 2019, provisional application No. 62/798,323, filed on Jan. 29, 2019, provisional application No. 62/798,326, filed on Jan. 29, 2019.

(51) Int. Cl.
| | |
|---|---|
| G01R 31/327 | (2006.01) |
| G01R 31/40 | (2020.01) |
| H02H 1/00 | (2006.01) |
| H02H 3/08 | (2006.01) |
| H01H 9/54 | (2006.01) |
| H02M 3/156 | (2006.01) |
| H03K 3/313 | (2006.01) |
| H03K 17/60 | (2006.01) |
| H04W 4/60 | (2018.01) |
| G06F 3/0484 | (2022.01) |
| G06F 3/04842 | (2022.01) |
| H04L 67/1095 | (2022.01) |
| H04L 67/148 | (2022.01) |
| H01H 1/50 | (2006.01) |
| H02H 3/06 | (2006.01) |
| H02H 3/087 | (2006.01) |
| H02H 7/26 | (2006.01) |
| H02H 9/02 | (2006.01) |
| H02H 9/08 | (2006.01) |
| H03K 3/45 | (2006.01) |
| H01H 47/00 | (2006.01) |
| H01H 71/04 | (2006.01) |

(52) U.S. Cl.
CPC .......... *G01R 31/40* (2013.01); *G06F 3/0484* (2013.01); *G06F 3/04842* (2013.01); *H01H 9/547* (2013.01); *H01H 50/045* (2013.01); *H02H 1/0007* (2013.01); *H02H 3/08* (2013.01); *H02M 3/156* (2013.01); *H03K 3/313* (2013.01); *H03K 17/601* (2013.01); *H04L 67/1095* (2013.01); *H04L 67/148* (2013.01); *H04W 4/60* (2018.02); *H01H 9/54* (2013.01); *H01H 2001/506* (2013.01); *H01H 2047/008* (2013.01); *H01H 2071/044* (2013.01); *H02H 3/06* (2013.01); *H02H 3/087* (2013.01); *H02H 7/26* (2013.01); *H02H 9/02* (2013.01); *H02H 9/08* (2013.01); *H03K 3/45* (2013.01)

(58) Field of Classification Search
CPC .......... H01H 2047/006; G01R 31/3278; G01R 31/327; H02H 3/08
USPC ........................................................ 361/42
See application file for complete search history.

(56) References Cited

U.S. PATENT DOCUMENTS

| | | | |
|---|---|---|---|
| 6,128,169 A | 10/2000 | Neiger et al. | |
| 6,297,569 B1 * | 10/2001 | Bartels | H01H 47/005 |
| | | | 307/140 |
| 7,705,601 B2 | 4/2010 | Zhou et al. | |
| 3,508,896 A1 | 8/2013 | Paoletti et al. | |
| 9,800,500 B2 | 10/2017 | West et al. | |
| 10,312,679 B2 | 6/2019 | Okerman | |
| 10,483,750 B2 | 11/2019 | Niehoff | |
| 10,763,659 B2 | 9/2020 | Henke et al. | |
| 11,195,670 B2 | 12/2021 | Henke et al. | |
| 2002/0097542 A1 | 7/2002 | Perichon | |
| 2002/0118495 A1 | 8/2002 | Beckert et al. | |
| 2003/0107851 A1 | 6/2003 | Grimm et al. | |
| 2010/0007997 A1 * | 1/2010 | Kao | H01H 9/542 |
| | | | 361/13 |
| 2010/0153022 A1 | 6/2010 | Chen et al. | |
| 2011/0128005 A1 * | 6/2011 | Weiher | H02H 3/044 |
| | | | 324/424 |
| 2011/0241692 A1 | 10/2011 | Akita et al. | |
| 2012/0123698 A1 | 5/2012 | Chen et al. | |
| 2013/0187389 A1 | 7/2013 | Thangamani et al. | |
| 2013/0286515 A1 | 10/2013 | White et al. | |
| 2013/0329329 A1 | 12/2013 | Liu et al. | |
| 2013/0335174 A1 * | 12/2013 | Kodama | H01H 47/002 |
| | | | 335/2 |
| 2016/0295652 A1 * | 10/2016 | Zotter | H01H 47/002 |
| 2018/0048143 A1 * | 2/2018 | Okerman | H02H 1/0015 |
| 2019/0199082 A1 | 6/2019 | Boesche et al. | |
| 2020/0028349 A1 * | 1/2020 | Elliott | G01R 15/16 |
| 2020/0244060 A1 | 7/2020 | Henke et al. | |
| 2021/0005401 A1 | 1/2021 | Henke et al. | |

FOREIGN PATENT DOCUMENTS

| | | |
|---|---|---|
| JP | H10285784 | 10/1998 |
| JP | 2001281275 | 10/2001 |
| JP | 2022547314 | 11/2022 |
| JP | 2022547315 | 11/2022 |
| WO | 2015197471 | 12/2015 |
| WO | 2021050455 | 3/2021 |
| WO | 2021050459 | 3/2021 |
| WO | 2021050460 | 3/2021 |
| WO | 2021050461 | 3/2021 |
| WO | 2021050830 | 3/2021 |

OTHER PUBLICATIONS

"International Application Serial No. PCT US2020 049812, International Preliminary Report on Patentability dated Mar. 24, 2022", 11 pgs.

"International Application Serial No. PCT US2020 049813, International Preliminary Report on Patentability dated Mar. 24, 2022", 9 pgs.

"International Application Serial No. PCT US2020 049814, International Preliminary Report on Patentability dated Mar. 24, 2022", 10 pgs.

"International Application Serial No. PCT US2020 050336, International Preliminary Report on Patentability dated Mar. 24, 2022", 7 pgs.

"U.S. Appl. No. 16 776,112, Non Final Office Action dated Apr. 16, 2020", 9 pgs.

"U.S. Appl. No. 16,776,112, Response Filed May 13, 2020 to Non-Final Office Action dated Apr. 16, 2020", 9 pgs.

"U.S. Appl. No. 16,776,112, Notice of Allowance dated Jul. 16, 2020", 9 pgs.

"U.S. Appl. No. 16,934,167, Preliminary Amendment Filed", 8 pgs.

"U.S. Appl. No. 16,934,167, Preliminary Amendment filed Sep. 28, 2020", 8 pgs.

"International Application Serial No. PCT US2020 049813, International Search Report dated Nov. 27, 2020", 3 pgs.

"International Application Serial No. PCT US2020 049813, Written Opinion dated Nov. 27, 2020", 7 pgs.

"International Application Serial No. PCT US2020 049814, International Search Report dated Nov. 30, 2020", 3 pgs.

"International Application Serial No. PCT US2020 049814, Written Opinion dated Nov. 30, 2020", 8 pgs.

"International Application Serial No. PCT US2020 049807, Invitation to Pay Additional Fees dated Dec. 1, 2020", 18 pgs.

(56) References Cited

OTHER PUBLICATIONS

"International Application Serial No. PCT US2020 049812, International Search Report dated Dec. 4, 2020", 3 pgs.
"International Application Serial No. PCT US2020 049812, Written Opinion dated Dec. 4, 2020", 9 pgs.
"International Application Serial No. PCT US2020 050336, International Search Report dated Dec. 18, 2020", 4 pgs.
"International Application Serial No. PCT US2020 050336, Written Opinion dated Dec. 18, 2020", 5 pgs.
"International Application Serial No. PCT US2020 050336, International Search Report dated Dec. 4, 2020", 3 pgs.
"International Application Serial No. PCT US2020 050336, Written Opinion dated Dec. 4, 2020", 5 pgs.
"International Application Serial No. PCT US2020 049807, International Search Report dated Feb. 1, 2021", 7 pgs.
"International Application Serial No. PCT US2020 049807, Written Opinion dated Feb. 1, 2021", 14 pgs.
"U.S. Appl. No. 16,934,167, Notice of Allowance dated Jul. 21, 2021", 12 pgs.
"U.S. Appl. No. 16,934,167, Corrected Notice of Allowability dated Nov. 9, 2021", 2 pgs.
U.S. Appl. No. 16/776,112 U.S. Appl. No. 10/763,359, filed Jan. 29, 2020, Power Contact Fault Clearing Device.
U.S. Appl. No. 16/934,167, filed Jul. 21, 2020, Power Contact Fault Clearing Device.
"European Application Serial No. 2078114.5, Response Filed Nov. 1, 22 to Communication pursuant to Rules 161(1) and 162 EPC dated Apr. 22, 2022", 13 pgs.
"European Application Serial No. 20780431.1, Response Filed Nov. 1, 22 to Communication pursuant to Rules 161(1) and 162 EPC dated Apr. 28, 2022", 15 pgs.
"Japanese Application Serial No. 2022-515950, Notification of Reasons for Rejection dated Apr. 4, 2023", W English Translation, 9 pgs.
"European Application Serial No. 20780835.3, European Voluntary Amendment dated Aug. 15, 2022", 11 pgs.
"European Application Serial No. 20785616.2, Response filed Aug. 19, 2022 to Communication Pursuant to Rules 161 and 162 EPC filed Apr. 22, 2022.", 14 pgs.
"Chinese Application Serial No. 202080074774.2, Office Action dated Jul. 24, 2023", with English translation, 15 pages.

* cited by examiner

POWER CONTACT FAULT CLEARING DEVICE

PRIORITY

This application is a continuation of U.S. patent application Ser. No. 16/934,167, filed Jul. 21, 2020, which application is a continuation of U.S. patent application Ser. No. 16/776,112, filed Jan. 29, 2020, issued Sep. 1, 2020 as U.S. Pat. No. 10,763,659, which application claims the benefit of priority to U.S. Provisional Application Ser. No. 62/798,316, filed Jan. 29, 2019; U.S. Provisional Application Ser. No. 62/798,323, filed Jan. 29, 2019; U.S. Provisional Application Ser. No. 62/798,326, filed Jan. 29, 2019; U.S. Provisional Application Ser. No. 62/898,780, filed Sep. 11, 2019, U.S. Provisional Application Ser. No. 62/898,783, filed Sep. 11, 2019, U.S. Provisional Application Ser. No. 62/898,787, filed Sep. 11, 2019, U.S. Provisional Application Ser. No. 62/898,795, filed Sep. 11, 2019, and U.S. Provisional Application Ser. No. 62/898,798, filed Sep. 11, 2019, the contents of all which are incorporated herein by reference in their entireties.

TECHNICAL FIELD

The present application relates generally to electrical contact sequencing, such as to control the OFF timing sequence of electrical contacts connected in parallel or in series with each other upon detection of a faulty condition.

BACKGROUND

Product designers, technicians, and engineers are trained to accept manufacturer specifications when selecting electromechanical relays and contactors. None of these specifications, however, indicate the serious impact of electrical contact arcing on the life expectancy of the relay or the contactor. This is especially true in high-power (e.g., over 2 Amp) applications.

Electrical current contact arcing may have a deleterious effect on electrical contact surfaces, such as relays and certain switches. Arcing may degrade and ultimately destroy the contact surface over time and may result in premature component failure, lower quality performance, and relatively frequent preventative maintenance needs. Additionally, arcing in relays, switches, and the like may result in the generation of electromagnetic interference (EMI) emissions. Electrical current contact arcing may occur both in alternating current (AC) power and in direct current (DC) power across the fields of consumer, commercial, industrial, automotive, and military applications. Because of its prevalence, there have literally been hundreds of specific means developed to address the issue of electrical current contact arcing.

SUMMARY

Various examples are now described to introduce a selection of concepts in a simplified form that is further described below in the detailed description. The Summary is not intended to identify key or essential features of the claimed subject matter, nor is it intended to be used to limit the scope of the claimed subject matter.

According to a first aspect of the present disclosure, there is provided an electrical circuit that includes a first pair of terminals adapted to be connected across a first set of switchable contacts. The electrical circuit further includes a second pair of terminals adapted to be connected across a second set of switchable contacts, the second set of switchable contacts coupled to an arc suppressor. The electrical circuit further includes a current sensor adapted to be connected between a power load and the second set of switchable contacts. The current sensor is configured to measure a power load current associated with the power load. The electrical circuit further includes a controller circuit operatively coupled to the current sensor and the first and second pairs of terminals. The controller circuit is configured to detect a fault condition based at least on the power load current and sequence deactivation of the first set of switchable contacts and the second set of switchable contacts based on the detected fault condition. During the deactivation, the second set of switchable contacts is deactivated prior to deactivation of the first set of switchable contacts.

According to a second aspect of the present disclosure, there is provided a system including a first pair of terminals adapted to be connected across a first set of switchable contacts. The system further includes a second pair of terminals adapted to be connected across a second set of switchable contacts. The system further includes an arc suppressor adapted to be coupled to the second set of switchable contacts. The system further includes a current sensor configured to measure a power load current associated with a power load coupled to the second set of switchable contacts. The system further includes a voltage sensor configured to measure contact voltage across the second set of switchable contacts. The system further includes a controller circuit operatively coupled to the current sensor, the voltage sensor, and the first and second pairs of terminals. The controller circuit is configured to detect a fault condition based on one or both of the power load current and the contact voltage, and sequence deactivation of the first set of switchable contacts and the second set of switchable contacts based on the detected fault condition.

According to a third aspect of the present disclosure, there is provided a method including coupling a signal converter circuit to a pair of terminals. The signal converter circuit is configured to convert a signal indicative of energization status of a first set of switchable contacts and a second set of switchable contacts into a logic level control signal. The signal is received from a driver circuit via the pair of terminals. A current sensor is coupled to the second set of switchable contacts. The current sensor is configured to measure a power load current associated with a power load coupled to the second set of switchable contacts. A voltage sensor is coupled to the second set of switchable contacts. The voltage sensor is configured to measure contact voltage across the second set of switchable contacts. A controller circuit is coupled to the current sensor and the voltage sensor. The controller circuit is configured to detect a fault condition based on one or both of the contact voltage and the power load current, and sequence activation or deactivation of the first set of switchable contacts and the second set of switchable contacts based on the logic level control signal and the fault condition. A status indicator is coupled to the controller circuit. The status indicator configured to provide an indication of the detected fault condition.

Any one of the foregoing examples may be combined with any one or more of the other foregoing examples to create a new embodiment within the scope of the present disclosure.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DETAILED DESCRIPTION

Figure 1:
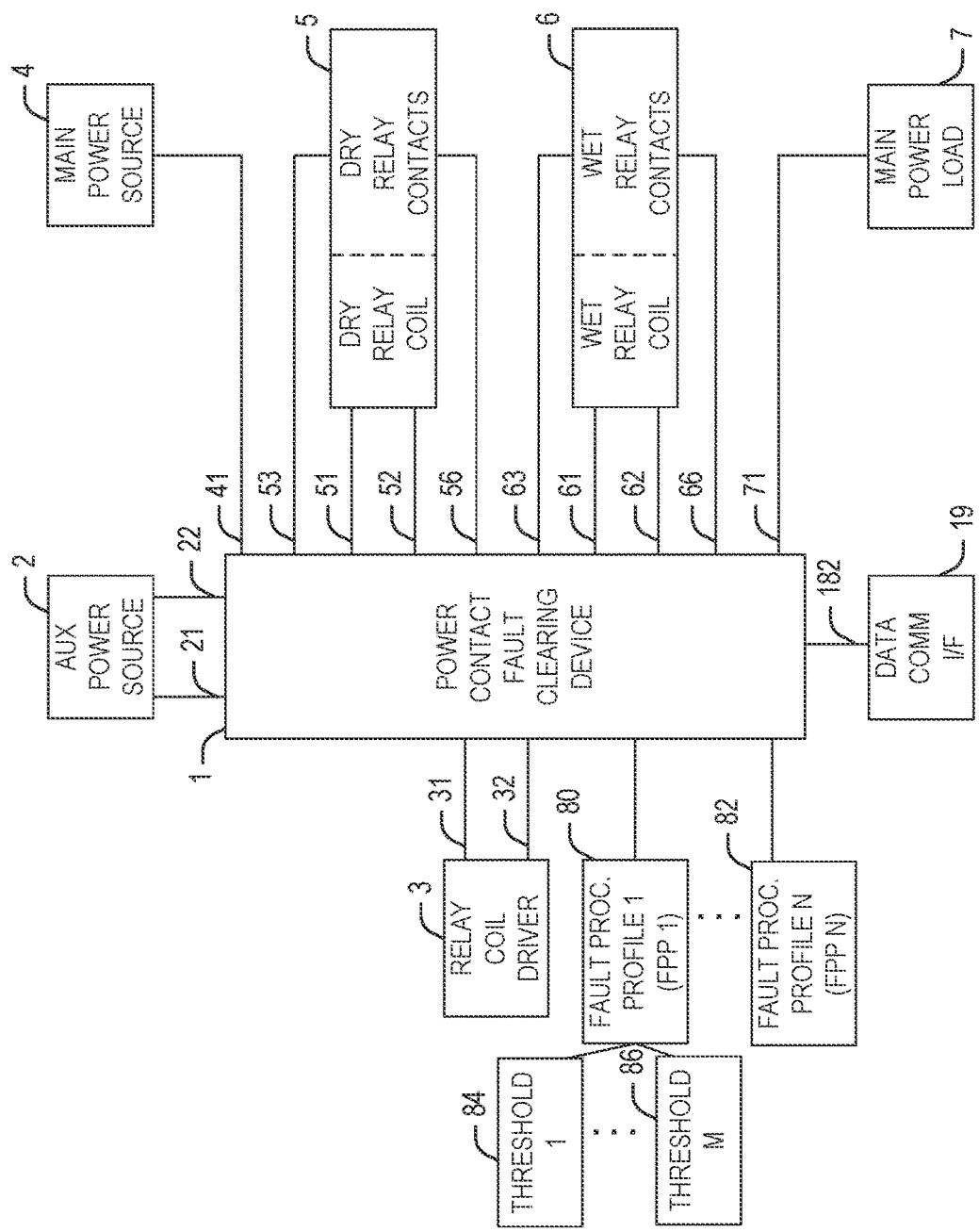
FIG. 1 is a diagram of a system including a power contact fault clearing device with an arc suppressor, according to some embodiments.

It should be understood at the outset that although an illustrative implementation of one or more embodiments is provided below, the disclosed systems, methods, and/or apparatuses described with respect to FIGS. 1-5 may be implemented using any number of techniques, whether currently known or not yet in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In the following description, reference is made to the accompanying drawings that form a part hereof, and in which are shown, by way of illustration, specific embodiments which may be practiced. These embodiments are described in sufficient detail to enable those skilled in the art to practice the inventive subject matter, and it is to be understood that other embodiments may be utilized, and that structural, logical, and electrical changes may be made without departing from the scope of the present disclosure. The following description of example embodiments is, therefore, not to be taken in a limiting sense, and the scope of the present disclosure is defined by the appended claims.

As used herein, the term "dry contact" (e.g., as used in connection with an interlock such as a relay or contactor) refers to a contact that is only carrying load current when closed. Such contact may not switch the load and may not make or break under load current. As used herein, the term "wet contact" (e.g., as used in connection with an interlock such as a relay or contactor) refers to a contact carrying load current when closed as well as switching load current during the make and break transitions.

Examples of power contact fault clearing devices and components utilized therein and in conjunction with power contact fault clearing devices are disclosed herein. Examples are presented without limitation and it is to be recognized and understood that the embodiments disclosed are illustrative and that the circuit and system designs described herein may be implemented with any suitable specific components to allow for the circuit and system designs to be utilized in a variety of desired circumstances. Thus, while specific components are disclosed, it is to be recognized and understood that alternative components may be utilized as appropriate.

An optimal way to address the shortcomings of a single contactor is to replace it with dual contactors or relays—a "wet" contact switch and a "dry" contact switch. Techniques disclosed herein relate to the design and configuration of a power contact fault clearing device to ensure better interlock performance and sequenced deactivation of the wet and dry contacts upon detecting a fault condition. More specifically, upon detecting a fault condition such as overcurrent and/or a fault arc, the power contact fault clearing device may use sequenced deactivation of the contacts so that the wet contact breaks first and the dry contact breaks last. In some aspects, in order to detect the fault condition, the power contact fault clearing device may include a current sensor measuring current through the main power load coupled to the contacts as well as one or more voltage sensors configured to detect a voltage across the wet or dry contacts. Additionally, multiple fault processing profiles associated with multiple fault conditions may be configured so that the power contact fault clearing device can determine/detect a fault condition from the multiple fault conditions based on the current and/or voltage sensed by the current sensor and the one or more voltage sensors and using one of the fault processing profiles.

In some aspects, the disclosed power contact fault clearing device may incorporate an arc suppression circuit (also referred to as an arc suppressor) coupled to the wet contact, to protect the wet contact from arcing during the make and break transitions and to reduce deleterious effects from contact arcing. The arc suppressor incorporated with the power contact fault clearing device discussed herein may include an arc suppressor as disclosed in the following issued U.S. Patents—U.S. Pat. Nos. 8,619,395 and 9,423,442, both of which are incorporated herein by reference in their entirety. Even though the figures depict a power contact fault clearing device 1 with an internal arc suppressor, the disclosure is not limited in this regard and the power contact fault clearing device 1 may also use an external arc suppressor.

In some aspects, a power contact fault clearing device 1 discussed herein may include elements of a wet/dry power contact sequencer. In some aspects, a power contact fault clearing device 1 discussed herein is a hybrid power switching circuit breaker using an internal or an external arc suppressor. In some aspects, a power contact fault clearing device 1 discussed herein is a hybrid power contactor using an internal or an external arc suppressor. In some aspects, a power contact fault clearing device 1 discussed herein is a hybrid power relay using an internal or an external arc suppressor.

FIG. 1 is a diagram of a system 100 including a power contact fault clearing device 1 with an arc suppressor, according to some embodiments. Referring to FIG. 1, the system 100 may include a power contact fault clearing device 1 coupled to an auxiliary power source 2, a relay coil driver 3, a main power source 4, a dry relay 5, a wet relay 6, a main power load 7, and a data communication interface 19.

Figure 2:
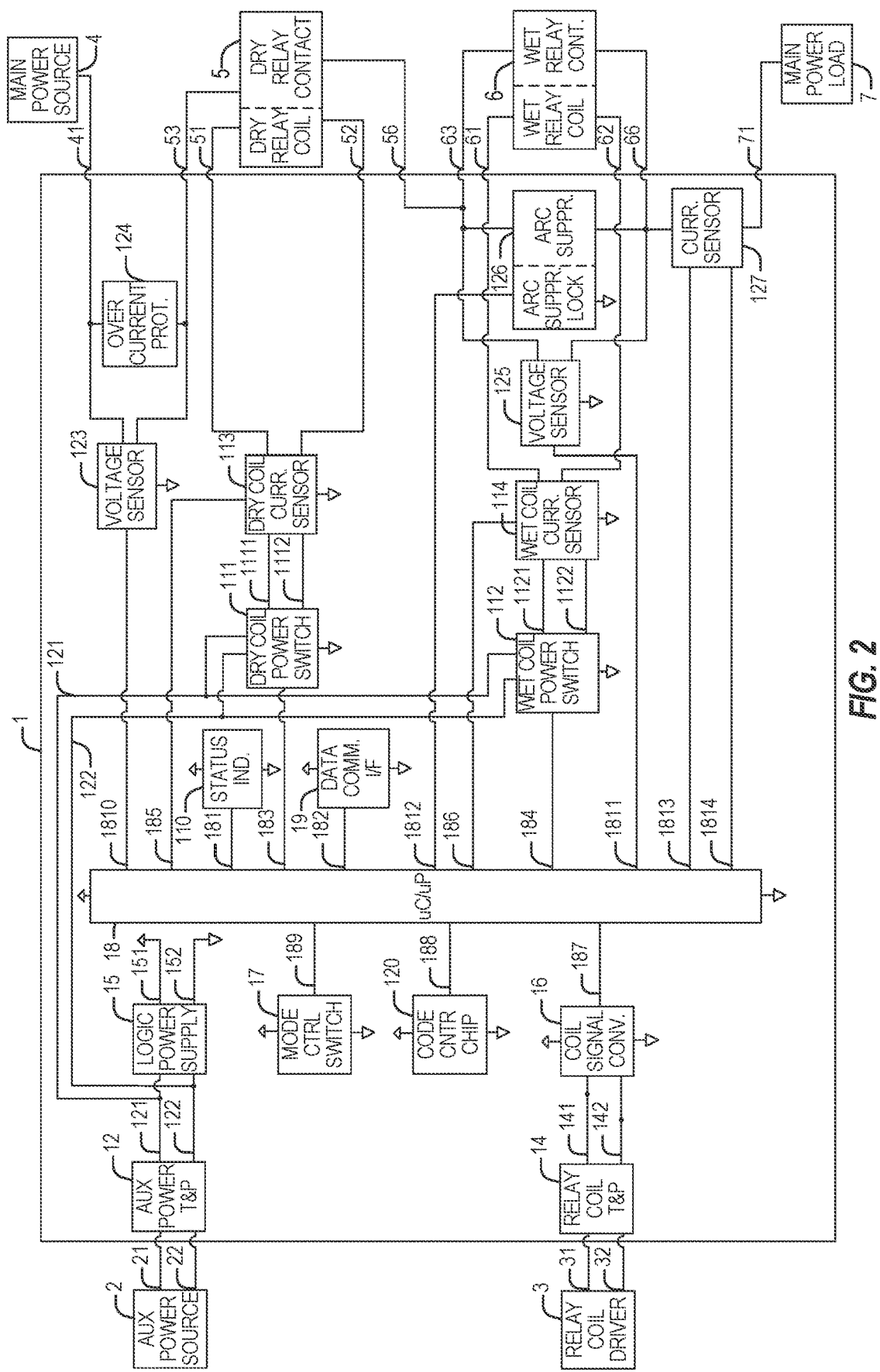
FIG. 2 is a block diagram of an example power contact fault clearing device with an arc suppressor, according to some embodiments.

The dry relay 5 may include a dry relay coil coupled to dry relay contacts, and the wet relay 6 may include a wet relay coil coupled to wet relay contacts. The dry relay 5 may be coupled to the main power source 4 via the power contact fault clearing device 1. The dry relay 5 may be coupled in series with the wet relay 6, and the wet relay 6 may be coupled to the main power load 7 via the power contact fault clearing device 1. Additionally, the wet relay 6 may be protected by an arc suppressor coupled across the wet relay contacts of the wet relay 6 (e.g., as illustrated in FIG. 2).

Without an arc suppressor connected, the wet contactor or relay 6 contacts may become sacrificial and the dry contactor or relay 5 contacts may remain in excellent condition during normal operation of the power contact fault clearing device 1, ensuring that the device clears a fault condition in the case where the wet relay contacts have failed.

The main power source 4 may be an AC power source or a DC power source. Sources four AC power may include generators, alternators, transformers, and the like. Source four AC power may be sinusoidal, non-sinusoidal, or phase controlled. An AC power source may be utilized on a power grid (e.g., utility power, power stations, transmission lines, etc.) as well as off the grid, such as for rail power. Sources for DC power may include various types of power storage, such as batteries, solar cells, fuel cells, capacitor banks, and thermopiles, dynamos, and power supplies. DC power types may include direct, pulsating, variable, and alternating (which may include superimposed AC, full wave rectification, and half wave rectification). DC power may be associated with self-propelled applications, i.e., articles that drive, fly, swim, crawl, dive, internal, dig, cut, etc. Even though FIG. 1 illustrates the main power source 4 as externally provided, the disclosure is not limited in this regard and the main power source may be provided internally, e.g., a battery or another power source. Additionally, the main power source 4 may be a single-phase or a multi-phase power source.

Even though FIG. 1 illustrates the power contact fault clearing device 1 coupled to a dry relay 5 and a wet relay 6 that include a relay coil and relay contacts, the disclosure is not limited in this regard and other types of interlock arrangements may be used as well, such as switches, contactors, or other types of interlocks. In some aspects, a contactor may be a specific, heavy duty, high current, embodiment of a relay.

The dry and wet contacts associated with the dry and wet relays in FIG. 1 may each include a pair of contacts, such as electrodes. In some aspects, the main power load 7 may be a general-purpose load, such as consumer lighting, computing devices, data transfer switches, etc. In some aspects, the main power load 7 may be a resistive load, such as a resistor, heater, electroplating device, etc. In some aspects, the main power load 7 may be a capacitive load, such as a capacitor, capacitor bank, power supply, etc. In some aspects, the main power load 7 may be an inductive load, such as an inductor, transformer, solenoid, etc. In some aspects, the main power load 7 may be a motor load, such as a motor, compressor, fan, etc. In some aspects, the main power load 7 may be a tungsten load, such as a tungsten lamp, infrared heater, industrial light, etc. In some aspects, the main power load 7 may be a ballast load, such as a fluorescent light, a neon light, a light emitting diode (LED), etc. In some aspects, the main power load 7 may be a pilot duty load, such as a traffic light, signal beacon, control circuit, etc.

The auxiliary power source 2 is an external power source that provides power to the wet and dry relay coils (of the wet relay 6 and the dry relay 5, respectively) according to the power contact fault clearing device 1. The first auxiliary power source node 21 may be configured as a first coil power termination input (e.g., to the auxiliary power termination and protection circuit 12 in FIG. 2). The second auxiliary power source node 22 may be configured as the second coil power termination input. The auxiliary power source 2 may be a single-phase or a multi-phase power source. Additionally, the coil power source 2 may be an AC power type or a DC power type.

The relay coil driver 3 is the external relay coil signal source which provides information about the energization status for the wet relay 6 coil and the dry relay 5 coil according to the control of the power contact fault clearing device 1. In this regard, the relay coil driver 3 is configured to provide a control signal. The first relay coil driver node 31 is a first coil driver termination input (e.g., to relay coil termination and protection circuit 14 in FIG. 2). The second relay coil driver node 32 may be configured as the second coil driver termination input. The relay coil driver 3 may be a single-phase or a multi-phase power source. Additionally, the relay coil driver 3 may be an AC power type or a DC power type.

The data communication interface 19 is an optional element that is coupled to the power contact fault clearing device 1 via one or more communication links 182. The data communication interface 19 may be coupled to external memory and may be used for, e.g., storing and retrieving data, such as fault processing profiles 80, . . . , 82 for detecting fault conditions as well as fault clearing algorithms for sequencing activation or deactivation of the dry and wet contacts upon detecting the fault conditions. An example fault clearing algorithm is discussed in connection with the timing diagram in FIG. 3.

Data communication may not be required for the full functional operation of the power contact fault clearing device 1. In some aspects, the data communication interface 19 can include one or more of the following elements: a digital signal isolator, an internal transmit data (TxD) termination, an internal receive data (RxD) termination, an external receive data (Ext RxD) termination, and an external transmit data (Ext TxD) termination.

Data signal filtering, transient, over-voltage, over-current, and wire termination are not shown in the example data communication interface 19 in FIG. 1 and FIG. 2. In some aspects, the data communications interface 19 can be configured as an interface between the power contact fault clearing device 1 and one or more of the following: a Bluetooth controller, an Ethernet controller, a General Purpose Data Interface, a Human-Machine-Interface, an SPI bus interface, a UART interface, a USB controller, and a Wi-Fi controller.

The dry relay 5 may include two sections—a dry relay coil and dry relay contacts. As mentioned above, "dry" refers to the specific mode of operation of the contacts in this relay which makes or breaks the current connection between the contacts while not carrying current.

The first dry relay node 51 is the first dry relay 5 coil input from the power contact fault clearing device 1. The second dry relay node 52 is the second dry relay 5 coil input from the power contact fault clearing device 1. The third dry relay node 53 is the first dry relay contact connection with the main power source 4. The fourth dry relay node 56 is the second dry relay contact connection (e.g., with the wet relay 6). The dry relay 5 may be configured to operate with a single-phase or a multi-phase power source. Additionally, the dry relay 5 may be an AC power type or a DC power type.

The wet relay 6 may include two sections—a wet relay coil and wet relay contacts. As mentioned above, "wet" refers to the specific mode of operation of the contacts in this relay which makes or breaks the current connection between the contacts while carrying current.

The first wet relay node 61 is the first wet relay 6 coil input from the power contact fault clearing device 1. The second wet relay node 62 is the second wet relay 6 coil input from the power contact fault clearing device 1. The third wet relay node 63 is the first wet relay contact connection (e.g., with the dry relay). The fourth wet relay node 66 is the second wet relay contact connection (e.g., with the current sensor 127). The wet relay 6 may be configured to operate with a single-phase or a multi-phase power source. Additionally, the wet relay 6 may be an AC power type or a DC power type.

In some aspects, the power contact fault clearing device 1 is configured to detect a fault condition using current and voltage sensor data in connection with a fault processing profile selected from a plurality of available fault processing profiles 80, . . . , 82. After the fault condition is detected, the power contact fault clearing device 1 may control the off timing sequencing of two contacts (either in series or in parallel) for the purpose of having the wet contact break the connection under current while the dry contact breaks the connection under no current. In some aspects, fault processing profile data (used to detect a fault condition) and specific power contact fault clearing algorithm data (used for sequencing the deactivation of multiple contacts based on the detected fault condition) may be located either in internal or external microcontroller/processor memory. Even though FIG. 1 illustrates the plurality of available fault processing profiles 80, . . . , 82 as being located outside of the power contact fault clearing device 1 (e.g., as may be stored in external memory), the disclosure is not limited in this regard and the plurality of available fault processing profiles 80, . . . , 82 may be stored within the power contact fault clearing device 1.

In some aspects, and as illustrated in FIG. 2, a current sensor (e.g., 127) may be used to sense current through the wet relay contacts. Additionally, a voltage sensor (e.g., 125) may be used to monitor the voltage across the wet relay contacts. The power contact fault clearing device 1 may use data from the current sensor and/or the voltage sensor to detect a fault condition (e.g., an overcurrent, a fault arc, or other types of fault conditions) based on a fault processing profile selected from the plurality of available fault processing profiles 80, . . . , 82. The selected fault processing profile (e.g., fault processing profile 80) may specify one or more threshold values (e.g., threshold values 84, . . . , 86) associated with the detected current (e.g., current through the main power load or through the dry or wet relay contacts) and/or voltage (e.g., voltage across the wet relay contacts). When current, voltage, a combination or function of the current and voltage, or other monitored parameters, exceed the threshold value(s) (e.g., 84, . . . , 86) specified in a fault processing profile, a fault condition is determined to be present. The power contact fault clearing device 1 may, within a few milliseconds of determining that a fault condition is present, apply a power contact fault clearing algorithm to sequence the deactivation of the wet and dry relay contacts for system turn-off.

In some aspects, the plurality of fault processing profiles 80, . . . , 82 may be configured based on a type of load used as the main power load 7 (e.g., different fault processing profiles may be configured for motor loads, transformer loads, capacitive loads, etc.).

In some aspects, a fault processing profile (e.g., 80) of the plurality of fault processing profiles 80, . . . , 82 may be based on current and power load type. For example, the current through a pair of contacts (e.g., the wet relay 6 contacts) may be measured and compared with a trip point current threshold (e.g., one of thresholds 84, . . . , 86). The fault processing profile 80 may specify that no action is taken for x milliseconds after the detected current reaches a value above the trip point current threshold. The fault processing profile 80 may also specify that sequenced deactivation of the wet and dry relay contacts is initiated after y milliseconds after the detected current reaches a value above the trip point current threshold. The sequenced deactivation can be based on a fault clearing algorithm, such as the fault clearing algorithm discussed in connection with FIG. 3.

In some aspects, a fault processing profile (e.g., 80) of the plurality of fault processing profiles 80, . . . , 82 may be based on a charge amount (e.g., expressed in Ampere-second) when the main power load 7 is configured for charge limiting. When the charge (e.g., as determined based on sensed current through the wet relay 6 contacts for a specific period of time) is higher than a threshold charge (e.g., configured as one of thresholds 84, . . . , 86), then sequenced deactivation of the wet and dry relay contacts is initiated. The sequenced deactivation can be based on a fault clearing algorithm, such as the fault clearing algorithm discussed in connection with FIG. 3.

In some aspects, a fault processing profile (e.g., 80) of the plurality of fault processing profiles 80, . . . , 82 may be based on detecting a fault in a power condition. For example, a voltage designation for system 100 for open load configurations may be known in advance. The complex power (e.g., as measured in VA) may be calculated using the detected current (e.g., current measured through the wet relay 6 contacts). When the complex power (e.g., as determined based on the sensed current and the voltage designation) is higher than a threshold power (e.g., configured as one of thresholds 84, . . . , 86), then sequenced deactivation of the wet and dry relay contacts is initiated. The sequenced deactivation can be based on a fault clearing algorithm, such as the fault clearing algorithm discussed in connection with FIG. 3.

In some aspects, a fault processing profile (e.g., 80) of the plurality of fault processing profiles 80, . . . , 82 may be based on detecting a fault in an energy condition. For example, the power contact fault clearing device 1 may determine energy (e.g., as measured in kWh or Wsec) based on sensed current (e.g., current measured through the wet relay 6 contacts) and sensed voltage (e.g., the voltage measured across the wet relay 6 contacts). When the determined energy is higher than a threshold energy value (e.g., configured as one of thresholds 84, . . . , 86), then sequenced deactivation of the wet and dry relay contacts is initiated. The sequenced deactivation can be based on a fault clearing algorithm, such as the fault clearing algorithm discussed in connection with FIG. 3.

In some aspects, a fault processing profile (e.g., 80) of the plurality of fault processing profiles 80, . . . , 82 may be based on detecting a fault arc across a pair of contacts (e.g., across the wet relay 6 contacts that are coupled to an arc suppressor 126). A fault arc may occur when the wet contacts are closed and current is high enough that the contact material melts and floats above the contacts, pushing the contacts apart. If the contacts momentarily separate and the voltage across the contacts is high enough (e.g., greater than 12V), a fault arc occurs. In this regard, conditions that may lead to a fault arc include sensed current above 100 mA and voltage across the contacts greater than 12V. Such threshold current and voltage values may be stores as thresholds 84, . . . , 86. When the sensed current and voltage across the contacts (e.g., wet relay 6 contacts) is detected to be higher than the current and voltage threshold values associated with creating a fault arc, then a fault arc is determined to have occurred and a sequenced deactivation of the wet and dry relay contacts is initiated. The sequenced deactivation can be based on a fault clearing algorithm, such as the fault clearing algorithm discussed in connection with FIG. 3.

In various examples of the power contact fault clearing device 1, stand-alone-operation does not necessarily require additional connections, devices or manipulations other than those outlined in the present specification. In some aspects, various implementations of the power contact fault clearing device 1 (e.g., in connection with various embodiments as illustrated in FIG. 1 and FIG. 2) may be configured to provide one or more of the following functionalities or features: AC or DC coil power and contact operation; authenticity and license control mechanisms; auto-detect functions; automatically generate service and maintenance calls; provide automatic fault detection; provide automatic power failure coil signal bypass; provide auto mode settings; provide a bar graph indicator; provide a behavior pattern learning resulting in out-of-pattern detection and indication; provide a Bluetooth interface; calculate, store and display historical data, values, and ranges for all signal inputs; calculate, store, and display statistical data, values, and ranges for all signal inputs; provide a code verification chip; provide coil fault detection and indication; provide communication access control; data communication interfaces and protocols; provide date and time event logging; enabling off-site troubleshooting; enabling faster cycle times; enabling lower duty cycles; enabling heavy duty operation with lighter duty contactors or relays; enabling high dielectric operation; enabling high power operation; enabling low leakage operation; enabling relays to replace contactors; encrypted data transmissions; provide an Ethernet interface; provide failure alarms; provide fault alerts; provide fault code clearing mechanisms; provide fault detection for out-of-spec or out-of-range parameters (e.g., chatter, cycle time, duty cycle, cycle speed, on duration, off duration, etc.); provide fault indication flash codes; provide fault history and statistics; provide hours-of-service counter; utilize hybrid power relays, contactors, and circuit breakers; utilize hybrid-power-switching controllers; provide LAN/WAN connectivity; provide connectivity for local or remote firmware upgradability, register access, system diagnostics, and remote troubleshooting; provide mode control selection; provide multi-phase configuration; provide operating mode indication; provide parameter history and statistics; provide power indication; provide processor status indication color codes; provide relay coil driver history and statistics; provide relay coil driver fault detection and indication; provide relay coil parameter history and statistics; provide relay coil state indication; provide processor status indication color codes; provide single-phase configuration; provide high dielectric isolation between power source and power load; support low leakage current between power source and power load; provide an SPI bus interface; provide triggering of automatic service calls; provide a universal data interface, such as Universal Asynchronous Receiver/Transmitter (UART) interface; and provide a USB interface, user access control, and a Wi-Fi interface.

FIG. 2 is a block diagram of an example power contact fault clearing device 1 with an arc suppressor, according to some embodiments. Referring to FIG. 2, the power contact fault clearing device 1 comprises an auxiliary power termination and protection circuit 12, a relay coil termination and protection circuit 14, a logic power supply 15, a coil signal converter 16, mode control switches 17, a controller (also referred to as microcontroller or microprocessor) 18, data communication interface 19, a status indicator 110, a code control chip 120, a voltage sensor 123, an overcurrent protection circuit 124, a voltage sensor 125, an arc suppressor 126, a current sensor 127, a dry coil power switch 111, a dry coil current sensor 113, a wet coil power switch 112, and a wet coil current sensor 114.

The auxiliary power termination and protection circuit 12 is configured to provide external wire termination and protection to all elements of the power contact fault clearing device 1. The first auxiliary power termination and protection circuit 12 node 121 is the first logic power supply 15 input, the first coil power switch 111 input, and the first coil power switch 112 input. The second auxiliary power termination and protection circuit 12 node 122 is the second logic power supply 15 input, the second coil power switch 111 input, and the second coil power switch 112 input.

In some aspects, the auxiliary power termination and protection circuit 12 is includes one or more of the following elements: a first relay coil driver terminal, a second relay coil driver terminal, an overvoltage protection, an overcurrent protection, a reverse polarity protection, optional transient and noise filtering, optional current sensor, and optional voltage sensor.

The relay coil termination and protection circuit 14 provides external wire termination and protection to all elements of the power contact fault clearing device 1. The first coil termination and protection circuit 14 node 141 is the first coil signal converter circuit 16 input. The second coil termination and protection circuit 14 node 142 is the second coil signal converter 16 input.

In some aspects, the relay coil termination and protection circuit 14 includes one or more of the following elements: a first relay coil driver terminal, a second relay coil driver terminal, an overvoltage protection, an overcurrent protection, a reverse polarity protection, optional transient and noise filtering, optional current sensor, and optional voltage sensor.

The logic power supply 15 is configured to provide logic level voltage to all digital logic elements of the power contact fault clearing device 1. The first logic power supply output 151 is the positive power supply terminal indicated by the positive power schematic symbol in FIG. 2. The second logic power supply output 152 is the negative power supply terminal indicated by the ground reference symbol in FIG. 2.

In some aspects, the logic power supply 15 includes one or more of the following elements: an AC-to-DC converter, input noise filtering, and transient protection, input bulk energy storage, output bulk energy storage, output noise filtering, a DC-to-DC converter (alternative), an external power converter (alternative), a dielectric isolation (internal or external), an overvoltage protection (internal or external), an overcurrent protection (internal or external), product safety certifications (internal or external), and electromagnetic compatibility certifications (internal or external).

The coil signal converter circuit 16 converts a signal indicative of the energization status of the wet and dry coils from the relay coil driver 3 into a logic level type signal communicated to the controller 18 via node 187 for further processing.

In some aspects, the coil signal converter 16 is comprised of one or more of the following elements: current limiting elements, dielectric isolation, signal indication, signal rectification, optional signal filtering, optional signal shaping, and optional transient and noise filtering.

The mode control switches 17 allow manual selection of specific modes of operation for the power contact fault clearing device 1. In some aspects, the mode control switches 17 include one or more of the following elements:

push buttons for hard resets, clearings or acknowledgements, DIP switches for setting specific modes of operation, and (alternatively in place of push buttons) keypad or keyboard switches.

The controller 18 comprises suitable circuitry, logic, interfaces, and/or code and is configured to control the operation of the power contact fault clearing device 1 through, e.g., software/firmware-based operations, routines, and programs. The first controller node 181 is the status indicator 110 connection. The second controller node 182 is the data communication interface 19 connection. The third controller node 183 is the dry coil power switch 111 connection. The fourth controller node 184 is the wet coil power switch 112 connection. The fifth controller node 185 is the dry coil current sensor 113 connection. The sixth controller node 186 is the wet coil current sensor 114 connection. The seventh controller node 187 is the coil signal converter circuit 16 connection. The eight controller node 188 is the code control chip 120 connection. The ninth controller node 189 is the mode control switches 17 connection. The tenth controller node 1810 is the overcurrent voltage sensor 123 connection. The eleventh controller node 1811 is the voltage sensor 125 connection. The twelfth controller node 1812 is the arc suppressor 126 lock connection. The thirteenth controller node 1813 is the first current sensor 127 connection. The fourteenth controller node 1814 is the second current sensor 127 connection.

In some aspects, controller 18 may be configured to control one or more of the following operations associated with the power contact fault clearing device 1: operation management; authenticity code control management; auto-detect operations; auto-detect functions; automatic normally closed or normally open contact form detection; auto mode settings; coil cycle (Off, Make, On, Break, Off) timing, history, and statistics; coil delay management; history management; contact sequencing; coil driver signal chatter history and statistics; data management (e.g., monitoring, detecting, recording, logging, indicating, and processing); data value registers for present, last, past, maximum, minimum, mean, average, standard deviation values, etc.; date and time formatting, logging, and recording; embedded microcontroller with clock generation, power on reset, and watchdog timer; error, fault, and failure management; factory default value recovery management; firmware upgrade management; flash code generation; fault indication clearing; fault register reset; hard reset; interrupt management; license code control management; power-on management; power-up sequencing; power hold-over management; power turn-on management; reading from inputs, memory, or registers; register address organization; register data factory default values; register data value addresses; register map organization; soft reset management; SPI bus link management; statistics management; system access management; system diagnostics management; UART communications link management; wet/dry relay coil management; and writing to memory, outputs, and registers.

The status indicator 110 provides audible, visual, or other user alerting methods through operational, health, fault, code indication via specific colors or flash patterns. In some aspects, the status indicator 110 may provide one or more of the following types of indications: bar graphs, graphic display, LEDs, a coil driver fault indication, a coil state indication, a dry coil fault indication, a mode of operation indication, a processor health indication, and wet coil fault indication.

The dry coil power switch 111 connects the externally provided coil power to the dry relay coil 5 via nodes 51 and 52 based on the signal output from controller 18 via command output node 183. In some aspects, the dry coil power switch 111 includes one or more of the following elements: solid-state relays, current limiting elements, and optional electromechanical relays.

The wet coil power switch 112 connects the externally provided coil power to the wet relay coil 6 via nodes 61 and 62 based on the signal output from controller 18 via command output node 184. In some aspects, the wet coil power switch 112 includes one or more of the following elements: solid-state relays, current limiting elements, and optional electromechanical relays.

The dry coil current sensor 113 is configured to sense the value and/or the absence or presence of the dry relay coil 5 current. In some aspects, the dry coil current sensor 113 includes one or more of the following elements: solid-state relays, a reverse polarity protection element, optoisolators, optocouplers, Reed relays and/or Hall effect sensors (optional), SSR AC or DC input (alternative), and SSR AC or DC output (alternative).

The wet coil current sensor 114 is configured to sense the value and/or the absence or presence of the dry relay coil 6 current. In some aspects, the wet coil current sensor 114 includes one or more of the following elements: solid-state relays, a reverse polarity protection element, optoisolators, optocouplers, Reed relays and/or Hall effect sensors (optional), SSR AC or DC input (alternative), and SSR AC or DC output (alternative).

The code control chip 120 is an optional element of the power contact fault clearing device 1, and it is not required for the fully functional operation of the device. In some aspects, the code control chip 120 may be configured to include application or customer specific code with encrypted or non-encrypted data security. In some aspects, the code control chip 120 function may be implemented externally via the data communication interface 19. In some aspects, the code control chip 120 may be configured to store the following information: access control code and data, alert control code and data, authentication control code and data, encryption control code and data, chip control code and data, license control code and data, validation control code and data, and/or checksum control code and data. In some aspects, the code control chip 120 may be implemented as an internal component of controller 18 or may be a separate circuit that is external to controller 18 (e.g., as illustrated in FIG. 2).

The voltage sensor 123 is configured to monitor the condition of the overcurrent protection 124. In some aspects, the voltage sensor 123 includes one or more of the following elements: solid-state relays, a bridge rectifier, current limiters, resistors, capacitors, reverse polarity protection elements, optoisolators, optocouplers, Reed relays and analog to digital converters (optional).

The overcurrent protection circuit 124 is configured to protect the power contact fault clearing device 1 from destruction in case of an overcurrent condition. In some aspects, the overcurrent protection circuit 124 includes one of more of the following elements: fusible elements, fusible printed circuit board traces, fuses, and circuit breakers.

The voltage sensor 125 is configured to monitor the voltage across the wet relay 6 contacts. In some aspects, the voltage sensor 125 includes one or more of the following elements: solid-state relays, a bridge rectifier, current limiters, resistors, capacitors, reverse polarity protection elements, and alternative or optional elements such as optoisolators, optocouplers, solid-state relays, Reed relays, and analog-to-digital converters.

The arc suppressor 126 is configured to provide arc suppression for the wet relay 6 contacts. The arc suppressor 126 may be either external to the power contact fault clearing device 1 or, alternatively, may be implemented as an integrated part of the power contact fault clearing device 1. The arc suppressor 126 may be configured to operate with a single-phase or a multi-phase power source. Additionally, the arc suppressor 8 may be an AC power type or a DC power type.

In some aspects, the arc suppressor 126 may be deployed for normal load conditions. In some aspects, the arc suppressor 126 may or may not be designed to suppress a contact fault arc in an overcurrent or contact overload condition.

In some aspects, the connection 1812 between the arc suppressor 126 lock and the controller 18 may be used for enabling (unlocking) the arc suppressor (e.g., when the relay coil driver signal is active) or disabling (locking) the arc suppressor (e.g., when the relay coil driver signal is inactive).

In some aspects, the arc suppressor 126 may detect a fault arc that has formed at the wet relay 6 contacts and may send a notification of the fault arc to the controller 18 for initiating a sequenced deactivation of the wet and dry relay contacts. In other aspects, the controller 18 may determine there is a fault arc (as a fault condition) based on using one of the fault protection profiles 80, . . . , 82 (e.g., based on current from current sensor 127 and voltage from voltage sensor 125 being above threshold values.

In some aspects, the arc suppressor 126 may be a single-phase or a multi-phase arc suppressor. Additionally, the arc suppressor may be an AC power type or a DC power type.

The current sensor 127 is configured to monitors the current through the wet relay 6 contacts. In some aspects, the current sensor 126 includes one of more of the following elements: solid-state relays, a bridge rectifier, current limiters, resistors, capacitors, reverse polarity protection elements, and alternative or optional elements such as optoisolators, optocouplers, Reed relays, and analog-to-digital converters.

In some aspects, the controller 18 status indicator output pin (SIO) pin 181 transmits the logic state to the status indicators 110. SIO is the logic label state when the status indicator output is high, and /SIO is the logic label state when the status indicator output is low.

In some aspects, the controller 18 data communication interface connection (TXD/RXD) 182 transmits the data logic state to the data communications interface 19. RXD is the logic label state identifying the receive data communications mark, and /RXD is the logic label state identifying the receive data communications space. TXD is the logic label state identifying the transmit data communications mark, and /TXD is the logic label state identifying the transmit data communications space.

In some aspects, the controller 18 dry coil output (DCO) pin 183 transmits the logic state to the dry coil power switch 111. DCO is the logic label state when the dry coil output is energized, and /DCO is the logic label state when the dry coil output is de-energized.

In some aspects, the controller 18 wet coil output pin (WCO) 184 transmits the logic state to the wet coil power switch 112. WCO is the logic state when the wet coil output is energized, and /WCO is the logic state when the wet coil output is de-energized.

In some aspects, the controller 18 dry coil input pin (DCI) 185 receives the logic state of the dry coil current sensor 113. DCI is the logic state when the dry coil current is absent, and /DCI is the logic state when the dry coil current is present.

In some aspects, the controller 18 wet coil input pin (WCI) 186 receives the logic state of the wet coil current sensor 114. WCI is the logic label state when the wet coil current is absent, and /WCI is the logic label state when the wet coil current is present.

In some aspects, the controller 18 coil driver input pin (CDI) 187 receives the logic state of the coil signal converter 16. CDI is the logic state of the de-energized coil driver. /CDI is the logic state of the energized coil driver.

In some aspects, the controller 18 code control connection (CCC) 188 receives and transmits the logic state of the code control chip 120. CCR is the logic label state identifying the receive data logic high, and /CCR is the logic label state identifying the receive data logic low. CCT is the logic label state identifying the transmit data logic high, and /CCT is the logic label state identifying the transmit data logic low.

In some aspects, the controller 18 mode control switch input pin (S) 189 receives the logic state from the mode control switches 17. S represents the mode control switch open logic state, and /S represents the mode control switch closed logic state.

In some aspects, the controller 18 connection 1810 receives the logic state from the overcurrent protection (OCP) voltage sensor 123. OCPVS is the logic label state when the OCP is not fused open, and /OCPVS is the logic label state when the OCP is fused open.

In some aspects, the controller 18 connection 1811 receives the logic state from the wet contact voltage sensor (VS) 125. WCVS is the logic label state when the VS is transmitting logic high, and /WCVS is the logic label state when the VS is transmitting logic low.

In some aspects, the controller 18 connection 1812 transmits the logic state to the arc suppressor 126 lock. ASL is the logic label state when the lock is locked, and /ASL is the logic label state when the lock is unlocked.

In some aspects, the controller 18 connections 1813 and 1814 receive the logic state from the contact current sensor 127. CCS is the logic label state when the contact current is absent, and /CCS is the logic label state when the contact current is present.

In some aspects, the controller 18 may configure one or more timers (e.g., in connection with detecting a fault condition and sequencing the deactivation of the wet and dry contacts). Example timer labels and definitions of different timers that may be configured by controller 18 include one or more of the following timers.

In some aspects, the coil driver input delay timer delays the processing for the logic state of the coil driver input signal. COIL_DRIVER_INPUT_DELAY_TIMER is the label when the timer is running.

In some aspects, the switch debounce timer delays the processing for the logic state of the switch input signal. SWITCH_DEBOUNCE_TIMER is the label when the timer is running.

In some aspects, the receive data timer delays the processing for the logic state of the receive data input signal. RECEIVE_DATA_DELAY_TIMER is the label when the timer is running.

In some aspects, the transmit data timer delays the processing for the logic state of the transmit data output signal. TRANSMIT_DATA_DELAY_TIMER is the label when the timer is running.

In some aspects, the wet coil output timer delays the processing for the logic state of the wet coil output signal. WET_COIL_OUTPUT_DELAY_TIMER is the label when the timer is running.

In some aspects, the wet current input timer delays the processing for the logic state of the wet current input signal. WET_CURRENT_INPUT_DELAY_TIMER is the label when the timer is running.

In some aspects, the dry coil output timer delays the processing for the logic state of the dry coil output signal. DRY_COIL_OUTPUT_DELAY_TIMER is the label when the timer is running.

In some aspects, the dry current input timer delays the processing for the logic state of the dry current input signal. DRY_CURRENT_INPUT_DELAY_TIMER is the label when the timer is running.

In some aspects, the signal indicator output delay timer delays the processing for the logic state of the signal indicator output. SIGNAL_INDICATOR_OUTPUT_DELAY_TIMER is the label when the timer is running.

Figure 3:
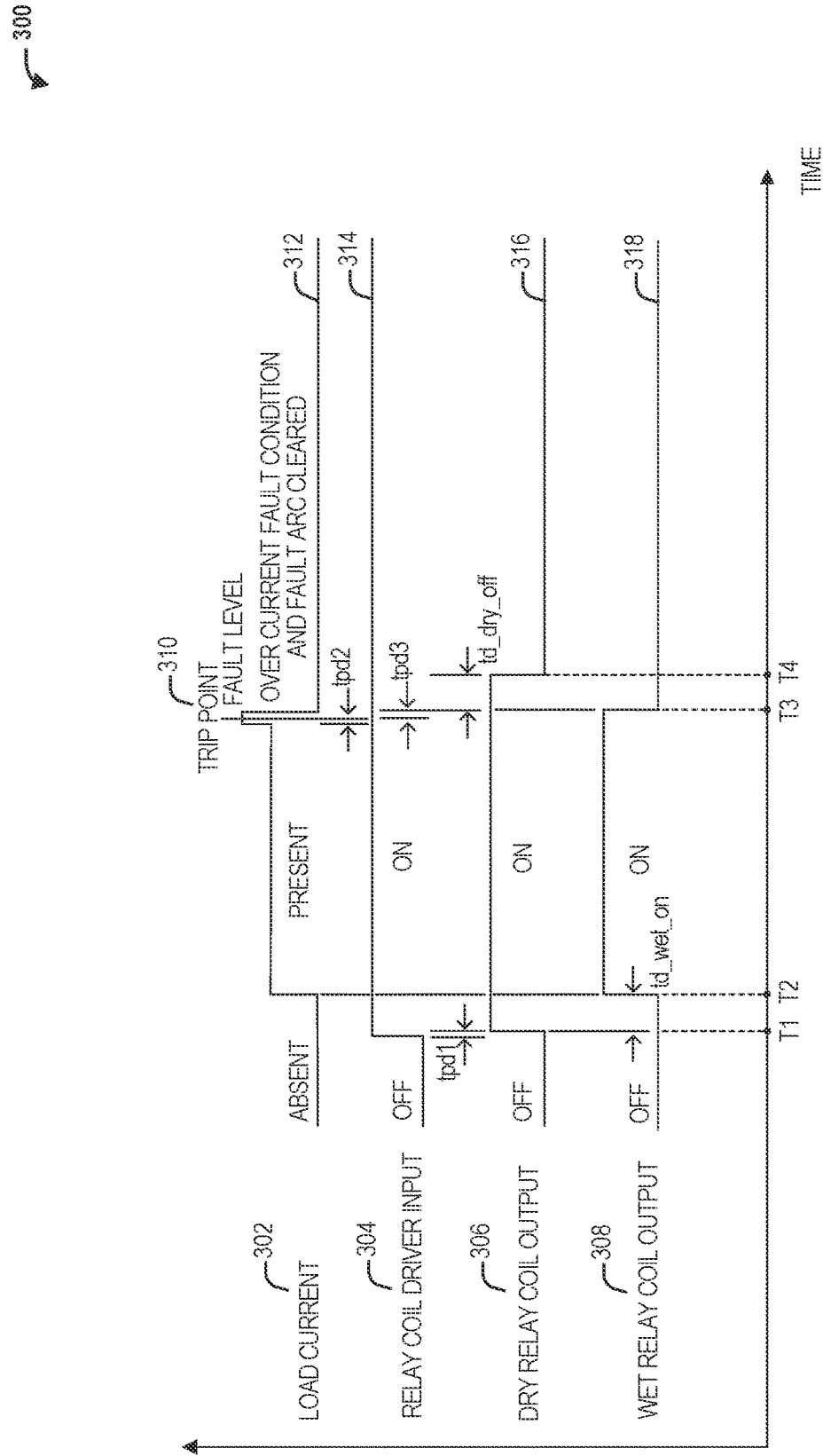
FIG. 3 depicts a timing diagram for sequencing dry and wet contacts based on detecting a fault condition using the example power contact fault clearing device of FIG. 2, according to some embodiments.

FIG. 3 depicts a timing diagram 300 for sequencing dry and wet contacts based on detecting a fault condition using the example power contact fault clearing device of FIG. 2, according to some embodiments. Referring to FIG. 3, the timing diagram 300 includes timing for load current 302, relay coil driver input 304, dry relay coil output 306, and with the relay coil output 308.

Prior to time T1, the relay coil driver input 304 (from relay coil driver 3) is OFF (indicating idle, non-energizing state of the contacts). At time T1, the relay coil driver input 304 is ON (indicating active, energizing state for the contacts). After a short propagation delay (tpd1), the dry relay coil output 306 changes from OFF to ON and the dry relay contact closes. After the wet relay coil on time delay (td_wet_on), at time T2, the wet relay coil output 308 changes from OFF to ON and the wet relay contacts close. At time T2 the load current 302 changes from absent to present.

During the load current "present" state, an over-current fault condition occurs. After a short propagation delay (tpd2), the load current 302 is high enough to activate the fault level trip point 310 (e.g., the current level is higher than a threshold value in one of the fault processing profiles 80, . . . , 82), resulting in overcurrent detection. Depending on the short circuit current rating of the contact, a fault arc may or may not have occurred at that time. After a short propagation delay (tpd3), at time T3, the wet relay coil output 308 changes from ON to OFF. The arc suppressed wet relay 6 contact opens and interrupts the fault current (and also interrupting a possible fault arc). At time T3, the load current changes from present to absent. After the dry coil off time delay (td_dry_off), at time T4, the dry relay 5 coil output 306 changes from ON to OFF. After time T4, both the wet and dry contacts are presenting an open contact condition with high dielectric isolation and with extremely low leakage current. The power contact fault clearing device 1 has thus cleared the overcurrent fault condition.

In some aspects, the power contact fault clearing device 1 registers may be located internally or externally to the controller 18. For example, the code control chip 120 can be configured to store the power contact fault clearing device 1 registers that are described hereinbelow.

In some aspects, address and data may be written into or read back from the registers through a communication interface using either UART, SPI or any other processor communication method.

In some aspects, the registers may contain data for the following operations: calculating may be understood to involve performing mathematical operations; controlling may be understood to involve processing input data to produce desired output data; detecting may be understood to involve noticing or otherwise detecting a change in the steady state; indicating may be understood to involve issuing notifications to the users; logging may be understood to involve associating dates, times, and events; measuring may be understood to involve acquiring data values about physical parameters; monitoring may be understood to involve observing the steady states for changes; processing may be understood to involve performing controller or processor-tasks for one or more events; and recording may be understood to involve writing and storing events of interest into mapped registers.

In some aspects, the power contact fault clearing device 1 registers may contain data arrays, data bits, data bytes, data matrixes, data pointers, data ranges, and data values.

In some aspects, the power contact fault clearing device 1 registers may store control data, default data, functional data, historical data, operational data, and statistical data. In some aspects, the power contact fault clearing device 1 registers may include authentication information, encryption information, processing information, production information, security information, and verification information. In some aspects, the power contact fault clearing device 1 registers may be used in connection with external control, external data processing, factory use, future use, internal control, internal data processing, and user tasks.

In some aspects, reading a specific register byte, bytes, or bits may reset the value to zero (0).

The following are example registers that can be configured for the power contact fault clearing device 1.

In some aspects, a mode register (illustrated in TABLE 1) may be configured to contain the data bits for the selected sequencer mode. For example, the sequencer may be shut down in order to reduce the current draw to a minimum level. Shutting down the sequencer powers down all active components of the power contact fault clearing device 1, including the controller 18. In this mode, the module may not respond to any external input or communication command. A temporary transition to the high state on the sequencer's external reset switch/pin is required to bring the power contact fault clearing device 1 back to normal operation. The power contact fault clearing device 1 may be pre-loaded with register default settings. In the default mode, the power contact fault clearing device 1 may operate stand-alone and independently as instructed by the factory default settings.

In some aspects, the following Read and Write commands may be used in connection with the mode register: Read @ 0x60, and Write @ 0x20.

TABLE 1

| Mode Register | BIT NUMBER | | | | | | | |
|---|---|---|---|---|---|---|---|---|
| FUNCTION | 7 | 6 | 5 | 4 | 3 | 2 | 1 | 0 |
| INDICATE_FAULTS & FAILURES | 1 | — | — | — | — | — | — | — |
| None | 0 | — | — | — | — | — | — | — |
| INDICATE_NONE | — | 1 | — | — | — | — | — | — |
| None | — | 0 | — | — | — | — | — | — |
| INDICATE_ALL | — | — | 1 | — | — | — | — | — |
| None | — | — | 0 | — | — | — | — | — |
| STOP_ON_FAILURE | — | — | — | 1 | — | — | — | — |
| None | — | — | — | 0 | — | — | — | — |

TABLE 1-continued

| Mode Register | BIT NUMBER | | | | | | | |
|---|---|---|---|---|---|---|---|---|
| FUNCTION | 7 | 6 | 5 | 4 | 3 | 2 | 1 | 0 |
| HALT_ON_FAULT | — | — | — | — | 1 | — | — | — |
| None | — | — | — | — | 0 | — | — | — |
| RESET | — | — | — | — | — | 1 | — | — |
| None | — | — | — | — | — | 0 | — | — |
| CLEAR | — | — | — | — | — | — | 1 | — |
| None | — | — | — | — | — | — | 0 | — |
| DEFAULT | — | — | — | — | — | — | — | 1 |
| None | — | — | — | — | — | — | — | 0 |

In some aspects, an alert register (illustrated in TABLE 2) may be configured to contain the data bits for the selected alert method.

In some aspects, the following Read and Write commands may be used in connection with the alert register: Read @ 0x61, and Write @ 0x21.

TABLE 2

| Alert Register | BIT NUMBER | | | | | | | |
|---|---|---|---|---|---|---|---|---|
| FUNCTION | 7 | 6 | 5 | 4 | 3 | 2 | 1 | 0 |
| VOICE | 1 | — | — | — | — | — | — | — |
| None | 0 | — | — | — | — | — | — | — |
| COMM | — | 1 | — | — | — | — | — | — |
| None | — | 0 | — | — | — | — | — | — |
| BUZZER | — | — | 1 | — | — | — | — | — |
| None | — | — | 0 | — | — | — | — | — |
| SPEAKER | — | — | — | 1 | — | — | — | — |
| None | — | — | — | 0 | — | — | — | — |
| RECORD | — | — | — | — | 1 | — | — | — |
| None | — | — | — | — | 0 | — | — | — |
| SOUND | — | — | — | — | — | 1 | — | — |
| None | — | — | — | — | — | 0 | — | — |
| DISPLAY | — | — | — | — | — | — | 1 | — |
| None | — | — | — | — | — | — | 0 | — |
| LED | — | — | — | — | — | — | — | 1 |
| None | — | — | — | — | — | — | — | 0 |

In some aspects, a code control register (illustrated in TABLE 3) may be configured to contain the data array pointers for the selected code type.

In some aspects, the following Read and Write commands may be used in connection with the code control register: Read @ 0x62, and Write @ 0x22.

TABLE 3

| Code Control Register | BIT NUMBER | | | | | | | |
|---|---|---|---|---|---|---|---|---|
| FUNCTION | 7 | 6 | 5 | 4 | 3 | 2 | 1 | 0 |
| CHECKSUM | 1 | — | — | — | — | — | — | — |
| None | 0 | — | — | — | — | — | — | — |
| VALIDATION | — | 1 | — | — | — | — | — | — |
| None | — | 0 | — | — | — | — | — | — |
| LICENSE | — | — | 1 | — | — | — | — | — |
| None | — | — | 0 | — | — | — | — | — |
| CHIP | — | — | — | 1 | — | — | — | — |
| None | — | — | — | 0 | — | — | — | — |
| ENCRYPT | — | — | — | — | 1 | — | — | — |
| None | — | — | — | — | 0 | — | — | — |
| AUTHENTIC | — | — | — | — | — | 1 | — | — |
| None | — | — | — | — | — | 0 | — | — |
| ALERT | — | — | — | — | — | — | 1 | — |
| None | — | — | — | — | — | — | 0 | — |
| ACCESS | — | — | — | — | — | — | — | 1 |
| None | — | — | — | — | — | — | — | 0 |

In some aspects, a contact limits register (illustrated in TABLE 4) may be configured to contain the data array pointers for the selected contact limit specification.

In some aspects, the following Read and Write commands may be used in connection with the contact limits register: Read @ 0x63, and Write @ 0x23.

TABLE 4

| Contact Limits Register | BIT NUMBER | | | | | | | |
|---|---|---|---|---|---|---|---|---|
| FUNCTION | 7 | 6 | 5 | 4 | 3 | 2 | 1 | 0 |
| MAX_MECH_LIFE | 1 | — | — | — | — | — | — | — |
| None | 0 | — | — | — | — | — | — | — |
| MAX_ELEC_LIFE | — | 1 | — | — | — | — | — | — |
| None | — | 0 | — | — | — | — | — | — |
| MAX_CYCLES_PER_MINUTE | — | — | 1 | — | — | — | — | — |
| None | — | — | 0 | — | — | — | — | — |
| MAX_DUTY_CYCLE | — | — | — | 1 | — | — | — | — |
| None | — | — | — | 0 | — | — | — | — |
| MIN_DUTY_CYCLE | — | — | — | — | 1 | — | — | — |
| None | — | — | — | — | 0 | — | — | — |
| MIN_OFF_DURATION | — | — | — | — | — | 1 | — | — |
| None | — | — | — | — | — | 0 | — | — |
| MIN_ON_DURATION | — | — | — | — | — | — | 1 | — |
| None | — | — | — | — | — | — | 0 | — |
| MIN_CYCLE_TIME | — | — | — | — | — | — | — | 1 |
| None | — | — | — | — | — | — | — | 0 |

In some aspects, a data communication register (illustrated in TABLE 5) may be configured to contain the data bits for the selected data communications method.

In some aspects, the following Read and Write commands may be used in connection with the data communication register: Read @ 0x64; and Write @0x24.

TABLE 5

| Data Comm Register | BIT NUMBER | | | | | | | |
|---|---|---|---|---|---|---|---|---|
| FUNCTION | 7 | 6 | 5 | 4 | 3 | 2 | 1 | 0 |
| PROTOCOL | 1 | — | — | — | — | — | — | — |
| None | 0 | — | — | — | — | — | — | — |
| HMI | — | 1 | — | — | — | — | — | — |
| None | — | 0 | — | — | — | — | — | — |
| BLUETOOTH | — | — | 1 | — | — | — | — | — |
| None | — | — | 0 | — | — | — | — | — |
| ETHERNET | — | — | — | 1 | — | — | — | — |
| None | — | — | — | 0 | — | — | — | — |
| WIFI | — | — | — | — | 1 | — | — | — |
| None | — | — | — | — | 0 | — | — | — |
| USB | — | — | — | — | — | 1 | — | — |
| None | — | — | — | — | — | 0 | — | — |
| SPI | — | — | — | — | — | — | 1 | — |
| None | — | — | — | — | — | — | 0 | — |
| UART | — | — | — | — | — | — | — | 1 |
| None | — | — | — | — | — | — | — | 0 |

In some aspects, a coil driver parameter register (illustrated in TABLE 6) may be configured to contain the data array pointers for the selected coil driver parameter specification.

In some aspects, the following Read and Write commands may be used in connection with the coil driver parameter register: Read @ 0x65, and Write @0x25.

TABLE 6

| Coil Driver Parameters Register | BIT NUMBER | | | | | | | |
|---|---|---|---|---|---|---|---|---|
| FUNCTION | 7 | 6 | 5 | 4 | 3 | 2 | 1 | 0 |
| COIL_DRIVER_PATTERN | 1 | — | — | — | — | — | — | — |
| None | 0 | — | — | — | — | — | — | — |
| COIL_DRIVER_OFF_CHATTER | — | 1 | — | — | — | — | — | — |
| None | — | 0 | — | — | — | — | — | — |
| COIL_DRIVER_ON_CHATTER | — | — | 1 | — | — | — | — | — |
| None | — | — | 0 | — | — | — | — | — |
| COIL_DRIVER_FREQUENCY | — | — | — | 1 | — | — | — | — |
| None | — | — | — | 0 | — | — | — | — |
| COIL_DRIVER_CYCLE_TIME | — | — | — | — | 1 | — | — | — |
| None | — | — | — | — | 0 | — | — | — |
| COIL_DRIVER_DUTY_CYCLE | — | — | — | — | — | 1 | — | — |
| None | — | — | — | — | — | 0 | — | — |
| COIL_DRIVER_ON_DURATION | — | — | — | — | — | — | 1 | — |
| None | — | — | — | — | — | — | 0 | — |
| COIL_DRIVER_OFF_DURATION | — | — | — | — | — | — | — | 1 |
| None | — | — | — | — | — | — | — | 0 |

In some aspects, a coil driver pattern register (illustrated in TABLE 7) may be configured to contain the data bits for the selected coil driver pattern condition.

In some aspects, the following Read and Write commands may be used in connection with the coil driver pattern register: Read @ 0x66, and Write @ 0x26.

TABLE 7

| Coil Driver Pattern Register | BIT NUMBER | | | | | | | |
|---|---|---|---|---|---|---|---|---|
| FUNCTION | 7 | 6 | 5 | 4 | 3 | 2 | 1 | 0 |
| COIL_DRIVER_PATTERN_AQUIRED | 1 | — | — | — | — | — | — | — |
| None | 0 | — | — | — | — | — | — | — |
| COIL_DRIVER_PATTERN_DETECTED | — | 1 | — | — | — | — | — | — |
| None | — | 0 | — | — | — | — | — | — |
| COIL_DRIVER_PATTERN_LEARNED | — | — | 1 | — | — | — | — | — |
| None | — | — | 0 | — | — | — | — | — |
| OUT_OF_COIL_DRIVER_PATTERN | — | — | — | 1 | — | — | — | — |
| None | — | — | — | 0 | — | — | — | — |
| IN_COIL_DRIVER_PATTERN | — | — | — | — | 1 | — | — | — |
| None | — | — | — | — | 0 | — | — | — |
| NO_COIL_DRIVER_PATTERN | — | — | — | — | — | 1 | — | — |
| None | — | — | — | — | — | 0 | — | — |
| AQUIRE_COIL_DRIVER_PATTERN | — | — | — | — | — | — | 1 | — |
| None | — | — | — | — | — | — | 0 | — |
| IGNORE_COIL_DRIVER_PATTERN | — | — | — | — | — | — | — | 1 |
| None | — | — | — | — | — | — | — | 0 |

In some aspects, a dry coil output delay timer register (illustrated in TABLE 8) may be configured to contain the values for the dry delay timing.

In some aspects, the following Read and Write commands may be used in connection with the dry relay register: Read @ 0x67, and Write @ 0x27.

TABLE 8

| Dry Delay Coil Output Delay Time Register | BIT NUMBER | | | | | | | |
|---|---|---|---|---|---|---|---|---|
| VALUE | 7 | 6 | 5 | 4 | 3 | 2 | 1 | 0 |
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a fault register (illustrated in TABLE 9) may be configured to contain the data bits for the selected fault condition.

In some aspects, the following Read and Write commands may be used in connection with the fault register: Read @ 0x68, and Write @ 0x28.

TABLE 9

| Fault Register | BIT NUMBER | | | | | | | |
|---|---|---|---|---|---|---|---|---|
| FUNCTION | 7 | 6 | 5 | 4 | 3 | 2 | 1 | 0 |
| COMM_FAULT | 1 | — | — | — | — | — | — | — |
| None | 0 | — | — | — | — | — | — | — |
| POWER_BROWN_OUT | — | 1 | — | — | — | — | — | — |
| None | — | 0 | — | — | — | — | — | — |
| WATCH_DOG_TIMER | — | — | 1 | — | — | — | — | — |
| None | — | — | 0 | — | — | — | — | — |
| POWER_FAULT | — | — | — | 1 | — | — | — | — |
| None | — | — | — | 0 | — | — | — | — |
| DEVICE_HEALTH | — | — | — | — | 1 | — | — | — |
| None | — | — | — | — | 0 | — | — | — |
| COIL_DRIVER_FAULT | — | — | — | — | — | 1 | — | — |
| None | — | — | — | — | — | 0 | — | — |
| DRY_COIL_FAULT | — | — | — | — | — | — | 1 | — |
| None | — | — | — | — | — | — | 0 | — |
| WET_COIL_FAULT | — | — | — | — | — | — | — | 1 |
| None | — | — | — | — | — | — | — | 0 |

In some aspects, a flash code register (illustrated in TABLE 10) may be configured to contain the data bits for the selected LED flash code colors.

In some aspects, the following Read and Write commands may be used in connection with the flash code register: Read @ 0x69, and Write @ 0x29.

TABLE 10

| LED Flash Code Register | BIT NUMBER | | | | | | | |
|---|---|---|---|---|---|---|---|---|
| FUNCTION | 7 | 6 | 5 | 4 | 3 | 2 | 1 | 0 |
| FLASH_CODE7 | 1 | — | — | — | — | — | — | — |
| None | 0 | — | — | — | — | — | — | — |
| FLASH_CODE6 | — | 1 | — | — | — | — | — | — |
| None | — | 0 | — | — | — | — | — | — |
| FLASH_CODE5 | — | — | 1 | — | — | — | — | — |
| None | — | — | 0 | — | — | — | — | — |
| FLASH_CODE4 | — | — | — | 1 | — | — | — | — |
| None | — | — | — | 0 | — | — | — | — |
| FLASH_CODE3 | — | — | — | — | 1 | — | — | — |
| None | — | — | — | — | 0 | — | — | — |

TABLE 10-continued

| LED Flash Code Register | BIT NUMBER | | | | | | | |
|---|---|---|---|---|---|---|---|---|
| FUNCTION | 7 | 6 | 5 | 4 | 3 | 2 | 1 | 0 |
| FLASH_CODE2 | — | — | — | — | — | 1 | — | — |
| None | — | — | — | — | — | 0 | — | — |
| FLASH_CODE1 | — | — | — | — | — | — | 1 | — |
| None | — | — | — | — | — | — | 0 | — |
| FLASH_CODE0 | — | — | — | — | — | — | — | 1 |
| None | — | — | — | — | — | — | — | 0 |

In some aspects, a history register (illustrated in TABLE 11) may be configured to contain the data array pointers for the selected history information.

In some aspects, the following Read and Write commands may be used in connection with the history register: Read @ 0x6A, and Write @ 0x2A.

TABLE 11

| History Register | BIT NUMBER | | | | | | | |
|---|---|---|---|---|---|---|---|---|
| FUNCTION | 7 | 6 | 5 | 4 | 3 | 2 | 1 | 0 |
| STATUS | 1 | — | — | — | — | — | — | — |
| None | 0 | — | — | — | — | — | — | — |
| STATE | — | 1 | — | — | — | — | — | — |
| None | — | 0 | — | — | — | — | — | — |
| MODE | — | — | 1 | — | — | — | — | — |
| None | — | — | 0 | — | — | — | — | — |
| FAULT | — | — | — | 1 | — | — | — | — |
| None | — | — | — | 0 | — | — | — | — |
| OUTPUT | — | — | — | — | 1 | — | — | — |
| None | — | — | — | — | 0 | — | — | — |
| INPUT | — | — | — | — | — | 1 | — | — |
| None | — | — | — | — | — | 0 | — | — |
| DRIVER | — | — | — | — | — | — | 1 | — |
| None | — | — | — | — | — | — | 0 | — |
| MODE | — | — | — | — | — | — | — | 1 |
| None | — | — | — | — | — | — | — | 0 |

In some aspects, an input register (illustrated in TABLE 12) may be configured to contain the data bits for the selected input status.

In some aspects, the following Read and Write commands may be used in connection with the input register: Read @ 0x6B, and Write @ 0x2B.

TABLE 12

| Input Register | BIT NUMBER | | | | | | | |
|---|---|---|---|---|---|---|---|---|
| FUNCTION | 7 | 6 | 5 | 4 | 3 | 2 | 1 | 0 |
| DCI | 1 | — | — | — | — | — | — | — |
| None | 0 | — | — | — | — | — | — | — |
| WCI | — | 1 | — | — | — | — | — | — |
| None | — | 0 | — | — | — | — | — | — |
| RXD | — | — | 1 | — | — | — | — | — |
| None | — | — | 0 | — | — | — | — | — |
| S2C | — | — | — | 1 | — | — | — | — |
| None | — | — | — | 0 | — | — | — | — |
| S2B | — | — | — | — | 1 | — | — | — |
| None | — | — | — | — | 0 | — | — | — |
| S2A | — | — | — | — | — | 1 | — | — |
| None | — | — | — | — | — | 0 | — | — |
| S1 | — | — | — | — | — | — | 1 | — |
| None | — | — | — | — | — | — | 0 | — |
| CDI | — | — | — | — | — | — | — | 1 |
| None | — | — | — | — | — | — | — | 0 |

In some aspects, an LED color register (illustrated in TABLE 13) may be configured to contain the data bits for the selected LED color.

In some aspects, the following Read and Write commands may be used in connection with the LED color register: Read @ 0x6C, and Write @ 0x2C.

TABLE 13

| LED Color Register | BIT NUMBER | | | | | | | |
|---|---|---|---|---|---|---|---|---|
| FUNCTION | 7 | 6 | 5 | 4 | 3 | 2 | 1 | 0 |
| RED | 1 | — | — | — | — | — | — | — |
| None | 0 | — | — | — | — | — | — | — |
| RED_ORANGE | — | 1 | — | — | — | — | — | — |
| None | — | 0 | — | — | — | — | — | — |
| ORANGE_YELLOW | — | — | 1 | — | — | — | — | — |
| None | — | — | 0 | — | — | — | — | — |
| ORANGE | — | — | — | 1 | — | — | — | — |
| None | — | — | — | 0 | — | — | — | — |
| YELLOW | — | — | — | — | 1 | — | — | — |
| None | — | — | — | — | 0 | — | — | — |
| YELLOW_GREEN | — | — | — | — | — | 1 | — | — |
| None | — | — | — | — | — | 0 | — | — |
| GREEN_YELLOW | — | — | — | — | — | — | 1 | — |
| None | — | — | — | — | — | — | 0 | — |
| GREEN | — | — | — | — | — | — | — | 1 |
| None | — | — | — | — | — | — | — | 0 |

In some aspects, an output register (illustrated in TABLE 14) may be configured to contain the data bit for the selected output status.

In some aspects, the following Read and Write commands may be used in connection with the output register: Read @ 0x6D, and Write @ 0x2D.

TABLE 14

| Output Register | BIT NUMBER | | | | | | | |
|---|---|---|---|---|---|---|---|---|
| FUNCTION | 7 | 6 | 5 | 4 | 3 | 2 | 1 | 0 |
| WET_COIL_OUTPUT | 1 | — | — | — | — | — | — | — |
| None | 0 | — | — | — | — | — | — | — |
| DRY_COIL_OUTPUT | — | 1 | — | — | — | — | — | — |
| None | — | 0 | — | — | — | — | — | — |
| TXD | — | — | 1 | — | — | — | — | — |
| None | — | — | 0 | — | — | — | — | — |
| ARC_SUPPRESOR_LOCK | — | — | — | 1 | — | — | — | — |
| None | — | — | — | 0 | — | — | — | — |
| Reserved | — | — | — | — | 1 | — | — | — |
| None | — | — | — | — | 0 | — | — | — |
| SIGNAL_INDICATOR_OUTPUT2 | — | — | — | — | — | 1 | — | — |
| None | — | — | — | — | — | 0 | — | — |
| SIGNAL_INDICATOR_OUTPUT1 | — | — | — | — | — | — | 1 | — |
| None | — | — | — | — | — | — | 0 | — |
| Reserved | — | — | — | — | — | — | — | 1 |
| None | — | — | — | — | — | — | — | 0 |

In some aspects, a state register (illustrated in TABLE 15) may be configured to contain the data array pointers for the selected state information.

In some aspects, the following Read and Write commands may be used in connection with the state register: Read @ 0x6E, and Write @ 0x2E.

TABLE 15

| State Register | BIT NUMBER | | | | | | | |
|---|---|---|---|---|---|---|---|---|
| FUNCTION | 7 | 6 | 5 | 4 | 3 | 2 | 1 | 0 |
| WET_COIL_ON | 1 | — | — | — | — | — | — | — |
| None | 0 | — | — | — | — | — | — | — |
| WET_COIL_OPN | — | 1 | — | — | — | — | — | — |
| None | — | 0 | — | — | — | — | — | — |

TABLE 15-continued

| State Register | BIT NUMBER | | | | | | | |
|---|---|---|---|---|---|---|---|---|
| FUNCTION | 7 | 6 | 5 | 4 | 3 | 2 | 1 | 0 |
| WET_COIL_OFF | — | — | 1 | — | — | — | — | — |
| None | — | — | 0 | — | — | — | — | — |
| DRY_COIL_ON | — | — | — | 1 | — | — | — | — |
| None | — | — | — | 0 | — | — | — | — |
| DRY_COIL_OPN | — | — | — | — | 1 | — | — | — |
| None | — | — | — | — | 0 | — | — | — |
| DRY_COIL_OFF | — | — | — | — | — | 1 | — | — |
| None | — | — | — | — | — | 0 | — | — |
| DRIVER_INPUT_ON | — | — | — | — | — | — | 1 | — |
| None | — | — | — | — | — | — | 0 | — |
| DRIVER_INPUT_OFF | — | — | — | — | — | — | — | 1 |
| None | — | — | — | — | — | — | — | 0 |

In some aspects, a statistics register (illustrated in TABLE 16) may be configured to contain the data array pointers for the selected statistics information.

In some aspects, the following Read and Write commands may be used in connection with the statistics register: Read @ 0x6F; and Write @ 0x2F.

TABLE 16

| Statistics Register | BIT NUMBER | | | | | | | |
|---|---|---|---|---|---|---|---|---|
| FUNCTION | 7 | 6 | 5 | 4 | 3 | 2 | 1 | 0 |
| STATUS | 1 | — | — | — | — | — | — | — |
| None | 0 | — | — | — | — | — | — | — |
| STATE | — | 1 | — | — | — | — | — | — |
| None | — | 0 | — | — | — | — | — | — |
| MODE | — | — | 1 | — | — | — | — | — |
| None | — | — | 0 | — | — | — | — | — |
| FAULT | — | — | — | 1 | — | — | — | — |
| None | — | — | — | 0 | — | — | — | — |
| OUTPUT | — | — | — | — | 1 | — | — | — |
| None | — | — | — | — | 0 | — | — | — |
| INPUT | — | — | — | — | — | 1 | — | — |
| None | — | — | — | — | — | 0 | — | — |
| DRIVER | — | — | — | — | — | — | 1 | — |
| None | — | — | — | — | — | — | 0 | — |
| MODE | — | — | — | — | — | — | — | 1 |
| None | — | — | — | — | — | — | — | 0 |

In some aspects, a status register (illustrated in TABLE 17) may be configured to contain the data array pointers for the selected status information.

In some aspects, the following Read and Write commands may be used in connection with the status register: Read @ 0x70, and Write @ 0x30.

TABLE 17

| Status Register | BIT NUMBER | | | | | | | |
|---|---|---|---|---|---|---|---|---|
| FUNCTION | 7 | 6 | 5 | 4 | 3 | 2 | 1 | 0 |
| CYCLE_COUNT | 1 | — | — | — | — | — | — | — |
| None | 0 | — | — | — | — | — | — | — |
| OPERATION_HALTED | — | 1 | — | — | — | — | — | — |
| None | — | 0 | — | — | — | — | — | — |
| SYSTEM_READY | — | — | 1 | — | — | — | — | — |
| None | — | — | 0 | — | — | — | — | — |
| FAILURES | — | — | — | 1 | — | — | — | — |
| None | — | — | — | 0 | — | — | — | — |
| FAILURE | — | — | — | — | 1 | — | — | — |
| None | — | — | — | — | 0 | — | — | — |
| FAULTS | — | — | — | — | — | 1 | — | — |
| None | — | — | — | — | — | 0 | — | — |
| FAULT | — | — | — | — | — | — | 1 | — |
| None | — | — | — | — | — | — | 0 | — |

TABLE 17-continued

| Status Register | BIT NUMBER | | | | | | | |
|---|---|---|---|---|---|---|---|---|
| FUNCTION | 7 | 6 | 5 | 4 | 3 | 2 | 1 | 0 |
| ALL_SYSTEMS_OK | — | — | — | — | — | — | — | 1 |
| None | — | — | — | — | — | — | — | 0 |

In some aspects, a version register (illustrated in TABLE 18) may be configured to contain the data array pointers for the version information.

In some aspects, the following Read and Write commands may be used in connection with the version register: Read @ 0x71, and Write @ 0x31.

TABLE 18

| Version Register | BIT NUMBER | | | | | | | |
|---|---|---|---|---|---|---|---|---|
| FUNCTION | 7 | 6 | 5 | 4 | 3 | 2 | 1 | 0 |
| PCB_REVISION | 1 | — | — | — | — | — | — | — |
| None | 0 | — | — | — | — | — | — | — |
| ASSEMBLY_REVISION | — | 1 | — | — | — | — | — | — |
| None | — | 0 | — | — | — | — | — | — |
| DATE_CODE | — | — | 1 | — | — | — | — | — |
| None | — | — | 0 | — | — | — | — | — |
| LOT_NUMBER | — | — | — | 1 | — | — | — | — |
| None | — | — | — | 0 | — | — | — | — |
| SERIAL_NUMBER | — | — | — | — | 1 | — | — | — |
| None | — | — | — | — | 0 | — | — | — |
| HARDWARE_VERSION | — | — | — | — | — | 1 | — | — |
| None | — | — | — | — | — | 0 | — | — |
| SOFTWARE_VERSION | — | — | — | — | — | — | 1 | — |
| None | — | — | — | — | — | — | 0 | — |
| FIRMWARE_VERSION | — | — | — | — | — | — | — | 1 |
| None | — | — | — | — | — | — | — | 0 |

In some aspects, a wet coil output delay timer register (illustrated in TABLE 19) may be configured to contain the values for the wet delay timing.

In some aspects, the following Read and Write commands may be used in connection with the wet coil output delay timer register: Read @ 0x72, and Write @ 0x32.

TABLE 19

| Wet Coil Output Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a switch debounce timer register (illustrated in TABLE 20) may be configured to contain the values for the switch debounce timing.

In some aspects, the following Read and Write commands may be used in connection with the switch debounce timer register: Read @ 0x73, and Write @0x33.

TABLE 20

| Switch Debounce Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a receive data timer register (illustrated in TABLE 21) may be configured to contain the values for the receive data timing.

In some aspects, the following Read and Write commands may be used in connection with the receive data timer mode register: Read @ 0x74, and Write @0x34.

TABLE 21

| Receive Data Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a transmit data delay timer register (illustrated in TABLE 22) may be configured to contain the values for the transmit data timing.

In some aspects, the following Read and Write commands may be used in connection with the transmit data delay timer register: Read @ 0x75, and Write @ 0x35.

TABLE 22

| Transmit Data Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a wet coil current input delay timer register (illustrated in TABLE 23) may be configured to contain the values for the wet coil output timing.

In some aspects, the following Read and Write commands may be used in connection with the wet coil current input delay timer register: Read @ 0x76, and Write @ 0x36.

TABLE 23

| Wet Coil Current Input Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a dry coil current input delay timer register (illustrated in TABLE 24) may be configured to contain a one or more-byte value.

In some aspects, the following Read and Write commands may be used in connection with the dry coil current input delay timer register: Read @ 0x77, and Write @ 0x37.

TABLE 24

| Dry Coil Current Input Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a signal indicator output delay timer register (illustrated in TABLE 25) may be configured to contain any one or more-byte value.

In some aspects, the following Read and Write commands may be used in connection with the signal indicator output delay timer register: Read @ 0x78, and Write @ 0x38.

TABLE 25

| Signal Indicator Output Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a sensor input register (illustrated in TABLE 26) may be configured to contain the data bits for the selected sensor status.

In some aspects, the following Read and Write commands may be used in connection with the sensor input register: Read @ 0x79, and Write @ 0x39.

TABLE 26

| Sensor Input Register | BIT NUMBER | | | | | | | |
|---|---|---|---|---|---|---|---|---|
| FUNCTION | 7 | 6 | 5 | 4 | 3 | 2 | 1 | 0 |
| Reserved | 1 | — | — | — | — | — | — | — |
| None | 0 | — | — | — | — | — | — | — |
| Reserved | — | 1 | — | — | — | — | — | — |
| None | — | 0 | — | — | — | — | — | — |
| Reserved | — | — | 1 | — | — | — | — | — |
| None | — | — | 0 | — | — | — | — | — |
| Reserved | — | — | — | 1 | — | — | — | — |
| None | — | — | — | 0 | — | — | — | — |
| FAULT_ARC_DETECTED | — | — | — | — | 1 | — | — | — |
| None | — | — | — | — | 0 | — | — | — |
| WET_CONTACT_CURRENT_SENSOR_BIT | — | — | — | — | — | 1 | — | — |
| None | — | — | — | — | — | 0 | — | — |
| WET_CONTACT_VOLTAGE_SENSOR_BIT | — | — | — | — | — | — | 1 | — |
| None | — | — | — | — | — | — | 0 | — |

TABLE 26-continued

| Sensor Input Register | BIT NUMBER | | | | | | | |
|---|---|---|---|---|---|---|---|---|
| FUNCTION | 7 | 6 | 5 | 4 | 3 | 2 | 1 | 0 |
| OCP_VOLTAGE_SENSOR_BIT | — | — | — | — | — | — | — | 1 |
| None | — | — | — | — | — | — | — | 0 |

In some aspects, an overcurrent protection voltage sensor register (illustrated in TABLE 27) may be configured to contain a one or more-byte value.

In some aspects, the following Read and Write commands may be used in connection with the overcurrent protection (OCP) voltage sensor register: Read @ 0x7A, and Write @ 0x3A.

TABLE 27

| OCP Voltage Sensor Register | BIT NUMBER | | | | | | | |
|---|---|---|---|---|---|---|---|---|
| VALUE | 7 | 6 | 5 | 4 | 3 | 2 | 1 | 0 |
| Maximum: Max Volts | 1 | 1 | 1 | 1 | 1 | 1 | 1 | 1 |
| Default: none | x | x | x | x | x | x | x | x |
| Minimum: Min Volts | 0 | 0 | 0 | 0 | 0 | 0 | 0 | 0 |

In some aspects, a wet contact voltage sensor register (illustrated in TABLE 28) may be configured to contain a one or more-byte value. The value may be expressed for example but not limited to as average, mean, median, rms or peak.

In some aspects, the following Read and Write commands may be used in connection with the wet contact voltage sensor register: Read @ 0x7B, and Write @ 0x3B.

TABLE 28

| Wet Contact Voltage Sensor Register | BIT NUMBER | | | | | | | |
|---|---|---|---|---|---|---|---|---|
| VALUE | 7 | 6 | 5 | 4 | 3 | 2 | 1 | 0 |
| Maximum: Max Volts | 1 | 1 | 1 | 1 | 1 | 1 | 1 | 1 |
| Default: none | x | x | x | x | x | x | x | x |
| Minimum: Min Volts | 0 | 0 | 0 | 0 | 0 | 0 | 0 | 0 |

In some aspects, a wet contact current sensor register (illustrated in TABLE 29) may be configured to contain a one or more-byte value. The value may be expressed for example but not limited to as average, mean, median, rms or peak.

In some aspects, the following Read and Write commands may be used in connection with the wet contact current sensor register: Read @ 0x7C, and Write @ 0x3C.

TABLE 29

| Wet Contact Current Sensor Register | BIT NUMBER | | | | | | | |
|---|---|---|---|---|---|---|---|---|
| VALUE | 7 | 6 | 5 | 4 | 3 | 2 | 1 | 0 |
| Maximum: Max Amps | 1 | 1 | 1 | 1 | 1 | 1 | 1 | 1 |
| Default: none | x | x | x | x | x | x | x | x |
| Minimum: Min Amps | 0 | 0 | 0 | 0 | 0 | 0 | 0 | 0 |

In some aspects, a fault arc parameter register (illustrated in TABLE 30) may be configured to contain the data bits for the selected sensor status.

In some aspects, the following Read and Write commands may be used in connection with the fault arc parameter register: Read @ 0x7D, and Write @0x3D.

TABLE 30

| Fault Arc Parameter Register | BIT NUMBER | | | | | | | |
|---|---|---|---|---|---|---|---|---|
| FUNCTION | 7 | 6 | 5 | 4 | 3 | 2 | 1 | 0 |
| FAULT_ARC_ENERGY | 1 | — | — | — | — | — | — | — |
| None | 0 | — | — | — | — | — | — | — |
| FAULT_ARC_DURATION | — | 1 | — | — | — | — | — | — |
| None | — | 0 | — | — | — | — | — | — |
| FAULT_ARC_POWER | — | — | 1 | — | — | — | — | — |
| None | — | — | 0 | — | — | — | — | — |
| FAULT_ARC_RESISTANCE_GRADIENT | — | — | — | 1 | — | — | — | — |
| None | — | — | — | 0 | — | — | — | — |
| FAULT_ARC_RESISTANCE | — | — | — | — | 1 | — | — | — |
| None | — | — | — | — | 0 | — | — | — |
| FAULT_ARC_CURRENT | — | — | — | — | — | 1 | — | — |
| None | — | — | — | — | — | 0 | — | — |
| FAULT_ARC_VOLTAGE_GRADIENT | — | — | — | — | — | — | 1 | — |
| None | — | — | — | — | — | — | 0 | — |
| FAULT_ARC_VOLTAGE | — | — | — | — | — | — | — | 1 |
| None | — | — | — | — | — | — | — | 0 |

In some aspects, an amperage trip point register (illustrated in TABLE 31) may be configured to contain the one or more-byte value for the specific trip point setting. The value may be expressed for example but not limited to as average, mean, median, rms or peak.

In some aspects, the following Read and Write commands may be used in connection with the amperage trip point register: Read @ 0x7E, and Write @0x3E.

TABLE 31

| AMPERAGE TRIP POINT REGSITER | BIT NUMBER | | | | | | | |
|---|---|---|---|---|---|---|---|---|
| VALUE | 7 | 6 | 5 | 4 | 3 | 2 | 1 | 0 |
| Maximum: Max Amps | 1 | 1 | 1 | 1 | 1 | 1 | 1 | 1 |
| Set-Amperage: none selected | x | x | x | x | x | x | x | x |
| Minimum: Min Amps | 0 | 0 | 0 | 0 | 0 | 0 | 0 | 0 |

In some aspects, an amperage trip delay register (illustrated in TABLE 32) may be configured to contain the one or more-byte value for the specific trip point setting. The value may be expressed for example but not limited to as average, mean, median, rms or peak.

In some aspects, the following Read and Write commands may be used in connection with the amperage trip delay register: Read @ 0x7F, and Write @0x3F.

TABLE 32

| Amperage Trip Delay Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Set-Amperage Trip Delay: none selected | x | x | x | x | x | x | x | x |
| Minimum: 0 ms | 0 | 0 | 0 | 0 | 0 | 0 | 0 | 0 |

In some aspects, a fault arc voltage register (illustrated in TABLE 33) may be configured to contain a one or more-byte value. The value may be expressed for example but not limited to as average, mean, median, rms or peak.

In some aspects, the following Read and Write commands may be used in connection with the fault arc voltage register: Read @ 0x80, and Write @ 0x40.

TABLE 33

| Fault Arc Voltage Register | BIT NUMBER | | | | | | | |
|---|---|---|---|---|---|---|---|---|
| VALUE | 7 | 6 | 5 | 4 | 3 | 2 | 1 | 0 |
| Maximum: Max Volts | 1 | 1 | 1 | 1 | 1 | 1 | 1 | 1 |
| Default: none | x | x | x | x | x | x | x | x |
| Minimum: Min Volts | 0 | 0 | 0 | 0 | 0 | 0 | 0 | 0 |

In some aspects, a fault arc voltage gradient register (illustrated in TABLE 34) may be configured to contain a one or more-byte value. The value may be expressed for example but not limited to as average, mean, median, rms or peak.

In some aspects, the following Read and Write commands may be used in connection with the fault arc voltage gradient register: Read @ 0x81, and Write @ 0x41.

TABLE 34

| Fault Arc Voltage Gradient Register | BIT NUMBER | | | | | | | |
|---|---|---|---|---|---|---|---|---|
| VALUE | 7 | 6 | 5 | 4 | 3 | 2 | 1 | 0 |
| Maximum: Max dV/dt | 1 | 1 | 1 | 1 | 1 | 1 | 1 | 1 |
| Default: none | x | x | x | x | x | x | x | x |
| Minimum: Min dV/dt | 0 | 0 | 0 | 0 | 0 | 0 | 0 | 0 |

In some aspects, a fault arc current register (illustrated in TABLE 35) may be configured to contain a one or more-byte value. The value may be expressed for example but not limited to as average, mean, median, rms or peak.

In some aspects, the following Read and Write commands may be used in connection with the fault arc current register: Read @ 0x82, and Write @ 0x42.

TABLE 35

| Fault Arc Current Register | BIT NUMBER | | | | | | | |
|---|---|---|---|---|---|---|---|---|
| VALUE | 7 | 6 | 5 | 4 | 3 | 2 | 1 | 0 |
| Maximum: Max Amps | 1 | 1 | 1 | 1 | 1 | 1 | 1 | 1 |
| Default: none | x | x | x | x | x | x | x | x |
| Minimum: Min Amps | 0 | 0 | 0 | 0 | 0 | 0 | 0 | 0 |

In some aspects, a fault arc resistance register (illustrated in TABLE 36) may be configured to contain a one or more-byte value. The value may be expressed for example but not limited to as average, mean, median, rms or peak.

In some aspects, the following Read and Write commands may be used in connection with the fault arc resistance register: Read @ 0x83, and Write @0x43.

TABLE 36

| Fault Arc Resistance Register | BIT NUMBER | | | | | | | |
|---|---|---|---|---|---|---|---|---|
| VALUE | 7 | 6 | 5 | 4 | 3 | 2 | 1 | 0 |
| Maximum: Max Ohms | 1 | 1 | 1 | 1 | 1 | 1 | 1 | 1 |
| Default: none | x | x | x | x | x | x | x | x |
| Minimum: Min Ohms | 0 | 0 | 0 | 0 | 0 | 0 | 0 | 0 |

In some aspects, a fault arc resistance gradient register (illustrated in TABLE 37) may be configured to contain a one or more-byte value. The value may be expressed for example but not limited to as average, mean, median, rms or peak.

In some aspects, the following Read and Write commands may be used in connection with the fault arc resistance gradient register: Read @ 0x84, and Write @ 0x44.

TABLE 37

| Fault Arc Resistance Gradient Register | BIT NUMBER | | | | | | | |
|---|---|---|---|---|---|---|---|---|
| VALUE | 7 | 6 | 5 | 4 | 3 | 2 | 1 | 0 |
| Maximum: Max dΩ/dt | 1 | 1 | 1 | 1 | 1 | 1 | 1 | 1 |
| Default: none | x | x | x | x | x | x | x | x |
| Minimum: Min dΩ/dt | 0 | 0 | 0 | 0 | 0 | 0 | 0 | 0 |

In some aspects, a fault arc power register (illustrated in TABLE 38) may be configured to contain a one or more-byte value. The value may be expressed for example but not limited to as average, mean, median, rms or peak.

In some aspects, the following Read and Write commands may be used in connection with the fault arc power register: Read @ 0x85, and Write @ 0x45.

TABLE 38

| Fault Arc Power Register | BIT NUMBER | | | | | | | |
|---|---|---|---|---|---|---|---|---|
| VALUE | 7 | 6 | 5 | 4 | 3 | 2 | 1 | 0 |
| Maximum: Max Watts | 1 | 1 | 1 | 1 | 1 | 1 | 1 | 1 |
| Default: none | x | x | x | x | x | x | x | x |
| Minimum: Min Watts | 0 | 0 | 0 | 0 | 0 | 0 | 0 | 0 |

In some aspects, a fault arc duration register (illustrated in TABLE 39) may be configured to contain a one or more-byte value. The value may be expressed for example but not limited to as average, mean, median, rms or peak.

In some aspects, the following Read and Write commands may be used in connection with the fault arc duration register: Read @ 0x86, and Write @ 0x46.

TABLE 39

| Fault Arc Duration Register | BIT NUMBER | | | | | | | |
|---|---|---|---|---|---|---|---|---|
| VALUE | 7 | 6 | 5 | 4 | 3 | 2 | 1 | 0 |
| Maximum: Max seconds | 1 | 1 | 1 | 1 | 1 | 1 | 1 | 1 |
| Default: none | x | x | x | x | x | x | x | x |
| Minimum: Min seconds | 0 | 0 | 0 | 0 | 0 | 0 | 0 | 0 |

In some aspects, a fault arc energy register (illustrated in TABLE 40) may be configured to contain a one or more-byte value. The value may be expressed for example but not limited to as average, mean, median, rms or peak.

In some aspects, the following Read and Write commands may be used in connection with the fault arc energy register: Read @ 0x87, and Write @ 0x47.

TABLE 40

| Fault Arc Energy Register | BIT NUMBER | | | | | | | |
|---|---|---|---|---|---|---|---|---|
| VALUE | 7 | 6 | 5 | 4 | 3 | 2 | 1 | 0 |
| Maximum: Max Joules | 1 | 1 | 1 | 1 | 1 | 1 | 1 | 1 |
| Default: none | x | x | x | x | x | x | x | x |
| Minimum: Min Joules | 0 | 0 | 0 | 0 | 0 | 0 | 0 | 0 |

Figure 4:
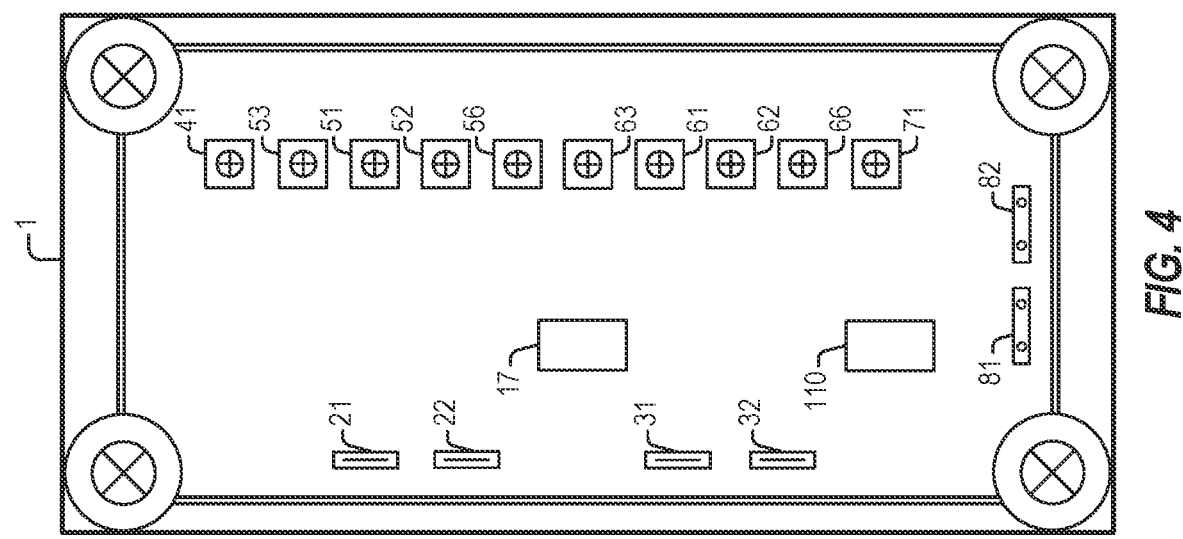
FIG. 4 depicts a packaging example of a power contact fault clearing device, according to some embodiments.

FIG. 4 depicts a packaging example of a power contact fault clearing device 1, according to some embodiments.

Figure 5:
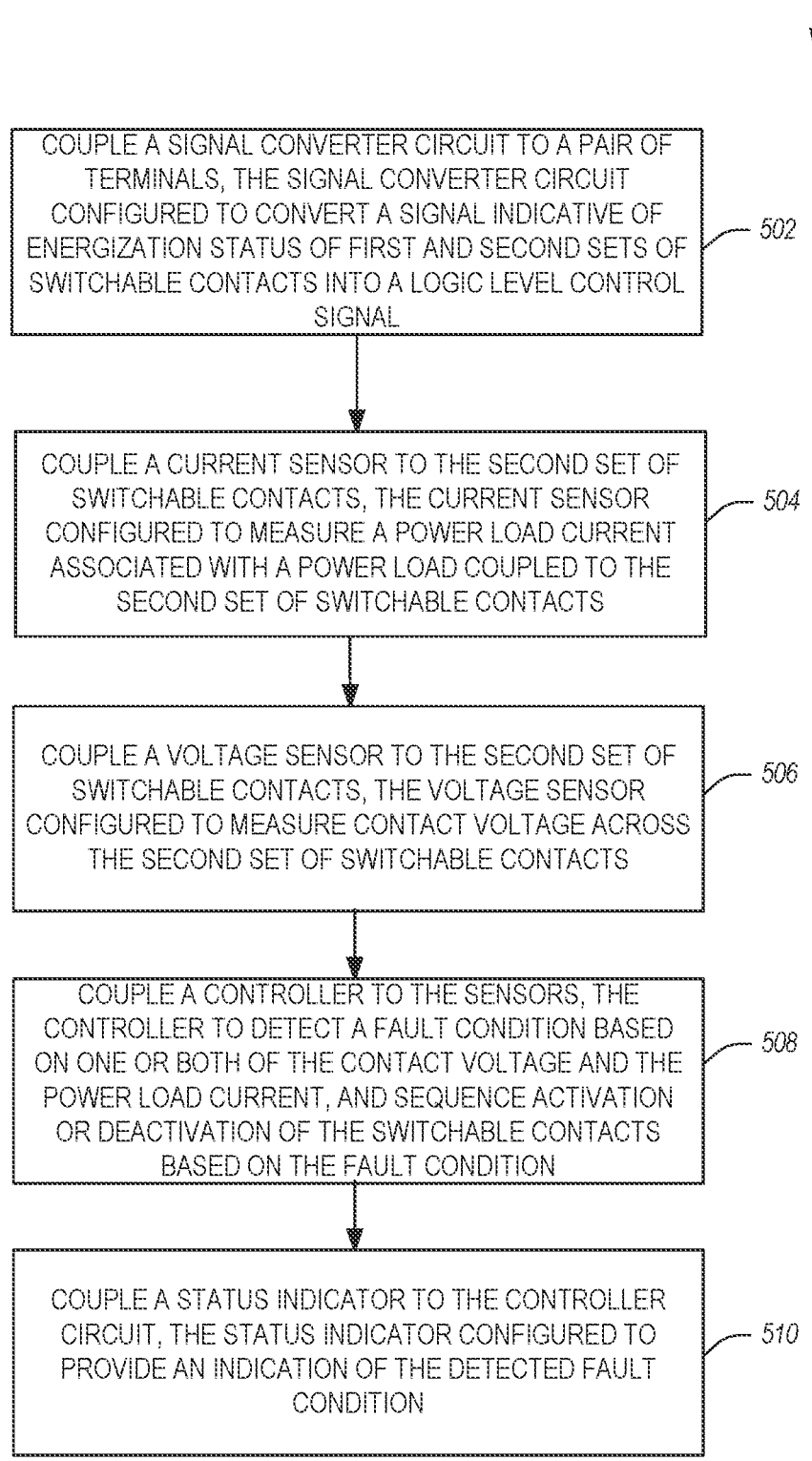
FIG. 5 is a flowchart of a method for detecting a fault condition during operation of a power contact fault clearing device, according to some embodiments.

FIG. 5 is a flowchart of a method 500 for detecting a fault condition during operation of a power contact fault clearing device, according to some embodiments. At operation 502, a signal converter circuit (e.g., 16) is coupled to a pair of terminals (e.g., the terminals coupled to the relay coil driver 3). The signal converter circuit is configured to convert a signal indicative of energization status of a first set of switchable contacts (e.g., the dry relay 5 contacts) and a second set of switchable contacts (e.g., the wet relay 6 contacts) into a logic level control signal. The signal indicative of energization status is received from a driver circuit (e.g., 3) via the pair of terminals.

At operation 504, a current sensor (e.g., 127) is coupled to the second set of switchable contacts (e.g., the wet relay 6 contacts). The current sensor is configured to measure a power load current associated with a power load (e.g., 7) coupled to the second set of switchable contacts.

At operation 506, a voltage sensor (e.g., 125) is coupled to the second set of switchable contacts. The voltage sensor is configured to measure contact voltage across the second set of switchable contacts.

At operation 508, a controller circuit (e.g., 18) is coupled to the current sensor (e.g., 127) and the voltage sensor (e.g., 125). The controller circuit is configured to detect a fault condition based on one or both of the contact voltage and the power load current. For example, the controller circuit 18 may use one or more of the fault processing profiles 80, . . . , 82 with corresponding thresholds (e.g., 84, . . . , 86) to detect a fault condition. The controller circuit may then sequence activation or deactivation of the first set of switchable contacts and the second set of switchable contacts based on the logic level control signal and the detected fault condition.

At operation 510, a status indicator (e.g., 110) is coupled to the controller circuit. The status indicator may be configured to provide an indication of the detected fault condition and/or an indication when the contacts have been deactivated as a result of the fault condition.

Additional Examples

The description of the various embodiments is merely exemplary in nature and, thus, variations that do not depart from the gist of the examples and detailed description herein are intended to be within the scope of the present disclosure. Such variations are not to be regarded as a departure from the spirit and scope of the present disclosure.

Example 1 is an electrical circuit, comprising: a first pair of terminals adapted to be connected across a first set of switchable contacts; a second pair of terminals adapted to be connected across a second set of switchable contacts, the second set of switchable contacts coupled to an arc suppressor; a current sensor adapted to be connected between a power load and the second set of switchable contacts, the current sensor configured to measure a power load current associated with the power load; and a controller circuit operatively coupled to the current sensor and the first and second pairs of terminals, the controller circuit configured to: detect a fault condition based at least on the power load current; and sequence deactivation of the first set of switchable contacts and the second set of switchable contacts based on the detected fault condition, wherein during the deactivation, the second set of switchable contacts is deactivated prior to deactivation of the first set of switchable contacts.

In Example 2, the subject matter of Example 1 includes, wherein the fault condition is based on a current level, and to detect the fault condition the controller circuit is configured to: retrieve a fault processing profile from a plurality of available fault processing profiles, the retrieved fault processing profile comprising a preconfigured current threshold level.

In Example 3, the subject matter of Example 2 includes, wherein to detect the fault condition the controller circuit is configured to: determine the power load current is higher than the preconfigured current threshold level for a preconfigured time duration.

In Example 4, the subject matter of Example 3 includes, wherein the preconfigured time duration is based on a type of load associated with the power load.

In Example 5, the subject matter of Examples 1-4 includes, wherein the fault condition is based on a charge amount associated with the power load current, and to detect the fault condition the controller circuit is configured to: determine the charge amount is greater than a preconfigured charge threshold level.

In Example 6, the subject matter of Examples 1-5 includes, wherein the fault condition is based on a power condition associated with the power load current, and to detect the fault condition the controller circuit is configured to: determine power associated with the power load current and a voltage designation of the electrical circuit is greater than a preconfigured power threshold level.

In Example 7, the subject matter of Examples 1-6 includes, a voltage sensor adapted to be connected between the second set of switchable contacts and determine voltage across the second set of switchable contacts.

In Example 8, the subject matter of Example 7 includes, wherein the fault condition is based on power associated with the power load current and the voltage across the second set of switchable contacts.

In Example 9, the subject matter of Example 8 includes, wherein to detect the fault condition the controller circuit is configured to: determine the power associated with the power load current and the voltage across the second set of switchable contacts is greater than a preconfigured power threshold level.

In Example 10, the subject matter of Examples 7-9 includes, wherein the fault condition is based on a presence of a fault arc in the arc suppressor.

In Example 11, the subject matter of Example 10 includes, wherein to detect the fault condition the controller circuit is configured to: determine the power load current is higher than a preconfigured current threshold level; and determine the voltage across the second set of switchable contacts is higher than a preconfigured voltage threshold level.

In Example 12, the subject matter of Examples 1-11 includes, an over-current protection circuit comprising a plurality of fusible elements and configured to couple the first set of switchable contacts with a power source.

In Example 13, the subject matter of Examples 1-12 includes, wherein the controller circuit is configured to sequence activation or deactivation of the first set of switchable contacts and the second set of switchable contacts based on a contact control signal, wherein during the activation, the first set of switchable contacts is activated prior to activation of the second set of switchable contacts, and during the deactivation, the second set of switchable contacts is deactivated prior to deactivation of the first set of switchable contacts.

In Example 14, the subject matter of Example 13 includes, a first power switching circuit operatively coupled to the first pair of terminals and the controller circuit, the first power switching circuit configured to switch power from an external power source and to trigger the activation or the deactivation of the first set of switchable contacts based on a first logic state signal from the controller circuit.

In Example 15, the subject matter of Example 14 includes, wherein the first power switching circuit is configured to supply power to the first pair of terminals to trigger the activation of the first set of switchable contacts when the first logic state signal from the controller circuit comprises a logic high state.

In Example 16, the subject matter of Examples 14-15 includes, wherein the first power switching circuit is configured to disconnect power to the first pair of terminals to trigger the deactivation of the first set of switchable contacts when the first logic state signal from the controller circuit comprises a logic low state.

In Example 17, the subject matter of Examples 14-16 includes, a second power switching circuit operatively coupled to the second pair of terminals and the controller circuit, the second power switching circuit configured to switch power from the external power source and to trigger the activation or the deactivation of the second set of switchable contacts based on a second logic state signal from the controller circuit.

In Example 18, the subject matter of Example 17 includes, wherein the second power switching circuit is configured to supply power to the second pair of terminals to trigger the activation of the second set of switchable contacts when the second logic state signal from the controller circuit comprises a logic high state.

In Example 19, the subject matter of Example 18 includes, wherein the second power switching circuit is configured to disconnect power to the second pair of terminals to trigger the deactivation of the second set of switchable contacts when the second logic state signal from the controller circuit comprises a logic low state.

In Example 20, the subject matter of Example 19 includes, wherein the first logic state signal and the second logic state signal are generated based on the contact control signal.

In Example 21, the subject matter of Examples 17-20 includes, wherein the controller circuit is configured to: configure the first logic state signal to trigger the activation of the first set of switchable contacts, when the contact control signal indicates an energized state for the first and second set of switchable contacts and the first and second set of switchable contacts are unpowered; initiate a first timer based on the activation of the first set of switchable contacts; and configure the second logic state signal to trigger the activation of the second set of switchable contacts, when the first timer expires.

In Example 22, the subject matter of Example 21 includes, wherein the controller circuit is to: configure the second logic state signal to trigger the deactivation of the first set of switchable contacts, when the contact control signal indicates a de-energized state for the first and second set of switchable contacts and the first and second set of switchable contacts are powered via the external power source; initiate a second timer based on the deactivation of the second set of switchable contacts; and configure the first logic state signal to trigger the deactivation of the first set of switchable contacts, when the second timer expires.

In Example 23, the subject matter of Examples 1-22 includes, wherein the first set of switchable contacts are configured to break or make a first connection under no current, and the second set of switchable contacts are configured to break or make a second connection under current.

In Example 24, the subject matter of Examples 1-23 includes, wherein the first set of switchable contacts comprises a first relay coil and first relay contacts, and the second set of switchable contacts comprises a second relay coil and second relay contacts, the second relay contacts coupled to the arc suppressor.

In Example 25, the subject matter of Examples 13-24 includes, wherein the contact control signal is a logic level control signal, and the electrical circuit further comprises: a signal converter circuit configured to convert a signal indicative of energization status of the first set of switchable contacts and the second set of switchable contacts into the logic level control signal.

In Example 26, the subject matter of Example 25 includes, wherein the signal converter circuit comprises a plurality of current limiting elements coupled to a bridge rectifier.

In Example 27, the subject matter of Examples 1-26 includes, a first current sensor operatively coupled to the first pair of terminals, the first current sensor configured to generate a first sensed current signal associated with detected current across the first set of switchable contacts; and a second current sensor operatively coupled to the second pair of terminals, the second current sensor configured to generate a second sensed current signal associated with detected current across the second set of switchable contacts.

In Example 28, the subject matter of Example 27 includes, wherein the first sensed current signal is indicative of a magnitude of the detected current across the first set of switchable contacts, and the second sensed current signal is indicative of a magnitude of the detected current across the second set of switchable contacts.

In Example 29, the subject matter of Examples 27-28 includes, wherein the first sensed current signal is indicative of presence or absence of current across the first set of switchable contacts, and the second sensed current signal is indicative of presence or absence of current across the second set of switchable contacts.

In Example 30, the subject matter of Examples 27-29 includes, wherein the first current sensor comprises a first reverse polarity protection element coupled to a first solid state relay, and wherein the first solid state relay is configured to output the first sensed current signal.

In Example 31, the subject matter of Example 30 includes, wherein the second current sensor comprises a second reverse polarity protection element coupled to a second solid state relay, and wherein the second solid state relay is configured to output the second sensed current signal.

In Example 32, the subject matter of Examples 1-31 includes, a status indicator coupled to the controller circuit, the status indicator configured to provide an indication of the detected fault condition.

Example 33 is a system, comprising: a first pair of terminals adapted to be connected across a first set of switchable contacts; a second pair of terminals adapted to be connected across a second set of switchable contacts; an arc suppressor adapted to be coupled to the second set of switchable contacts; a current sensor configured to measure a power load current associated with a power load coupled to the second set of switchable contacts; a voltage sensor configured to measure contact voltage across the second set of switchable contacts; and a controller circuit operatively coupled to the current sensor, the voltage sensor, and the first and second pairs of terminals, the controller circuit configured to: detect a fault condition based on one or both of the power load current and the contact voltage; and sequence deactivation of the first set of switchable contacts and the second set of switchable contacts based on the detected fault condition.

In Example 34, the subject matter of Example 33 includes, wherein the fault condition is based on a current level, and to detect the fault condition the controller circuit is configured to: determine the power load current is higher than a preconfigured current threshold level.

In Example 35, the subject matter of Example 34 includes, wherein to detect the fault condition the controller circuit is configured to: determine the power load current is higher than the preconfigured current threshold level for a preconfigured time duration.

In Example 36, the subject matter of Examples 33-35 includes, wherein the fault condition is based on a charge amount associated with the power load current, and to detect the fault condition the controller circuit is configured to: determine the charge amount is greater than a preconfigured charge threshold level.

In Example 37, the subject matter of Examples 33-36 includes, wherein the fault condition is based on a power condition associated with the power load current, and to detect the fault condition the controller circuit is configured to: determine power associated with the power load current and a voltage designation of the first and second sets of switchable contacts is greater than a preconfigured power threshold level.

In Example 38, the subject matter of Examples 33-37 includes, wherein the fault condition is based on power associated with the power load current and the voltage across the second set of switchable contacts, and to detect the fault condition the controller circuit is configured to: determine the power associated with the power load current and the voltage across the second set of switchable contacts is greater than a preconfigured power threshold level.

In Example 39, the subject matter of Examples 33-38 includes, wherein the fault condition is based on a presence of a fault arc in the arc suppressor, and to detect the fault condition the controller circuit is configured to: determine the power load current is higher than a preconfigured current threshold level; and determine the voltage across the second set of switchable contacts is higher than a preconfigured voltage threshold level.

In Example 40, the subject matter of Examples 33-39 includes, wherein during the deactivation, the second set of switchable contacts is deactivated prior to deactivation of the first set of switchable contacts.

Example 41 is a method, comprising: coupling a signal converter circuit to a pair of terminals, the signal converter circuit configured to convert a signal indicative of energization status of a first set of switchable contacts and a second set of switchable contacts into a logic level control signal, the signal received from a driver circuit via the pair of terminals; coupling a current sensor to the second set of switchable contacts, the current sensor configured to measure a power load current associated with a power load coupled to the second set of switchable contacts; coupling a voltage sensor to the second set of switchable contacts, the voltage sensor configured to measure contact voltage across the second set of switchable contacts; coupling a controller circuit to the current sensor and the voltage sensor, the controller circuit configured to detect a fault condition based on one or both of the contact voltage and the power load current, and sequence activation or deactivation of the first set of switchable contacts and the second set of switchable contacts based on the logic level control signal and the fault condition; and coupling a status indicator to the controller circuit, the status indicator configured to provide an indication of the detected fault condition.

In Example 42, the subject matter of Example 41 includes, coupling an arc suppressor in parallel with the second set of switchable contacts.

In Example 43, the subject matter of Example 42 includes, wherein the fault condition is based on a presence of a fault arc in the arc suppressor, and to detect the fault condition the controller circuit is configured to: determine the power load current is higher than a preconfigured current threshold level; and determine the voltage across the second set of switchable contacts is higher than a preconfigured voltage threshold level.

In Example 44, the subject matter of Examples 41-43 includes, wherein the fault condition is based on a current level, and to detect the fault condition the controller circuit is configured to determine the power load current is higher than a preconfigured current threshold level.

Example 45 is at least one machine-readable medium including instructions that, when executed by processing circuitry, cause the processing circuitry to perform operations to implement of any of Examples 1-44.

Example 46 is an apparatus comprising means to implement of any of Examples 1-44.

Example 47 is a system to implement of any of Examples 1-44.

Example 48 is a method to implement of any of Examples 1-44.

The above detailed description includes references to the accompanying drawings, which form a part of the detailed description. The drawings show, by way of illustration, specific embodiments. These embodiments are also referred to herein as "examples." Such examples may include elements in addition to those shown and described. However, the present inventor also contemplates examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the scope disclosed herein.

The above description is intended to be, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. In addition, in the above Detailed Description, various features may be grouped together to streamline the disclosure. This should not be interpreted as intending that an unclaimed disclosed feature is essential to any claim. Rather, the inventive subject matter may lie in less than all features of a particular disclosed embodiment. Thus, the following claims are hereby incorporated into the Detailed Description, with each claim standing on its own as a separate embodiment.

What is claimed is:

1. An electrical circuit, comprising:
  a contact with a pair of switchable electrodes, the contact configured to cycle through make and break transitions while conducting current;
  an arc suppressor operatively coupled across the pair of switchable electrodes and configured to extinguish an arc formed across the pair of switchable electrodes during the make and break transitions of the contact;
  at least one sensor coupled to the pair of switchable electrodes, the at least one sensor configured to generate sensor data; and
  a controller circuit operatively coupled to the at least one sensor, the arc suppressor, and the pair of switchable electrodes, the controller circuit comprising a plurality of registers and configured to:
    detect a fault condition associated with the contact based on the sensor data; and
    sequence contact opening of the contact based on the detected fault condition and a timing value associated with the fault condition and stored in at least one register of the plurality of registers,
    wherein when the fault condition is based on a presence of a fault arc between the pair of switchable electrodes, the at least one register comprises a fault arc parameter register storing at least one parameter associated with the fault arc.

2. The electrical circuit of claim 1, wherein the at least one register is a delay timing register storing the timing value.

3. The electrical circuit of claim 2, wherein the timing value configures a time delay for sequencing the contact opening of the contact prior to contact opening of at least a second contact associated with the make and break transitions.

4. The electrical circuit of claim 1, wherein the at least one sensor is one of a current sensor or a voltage sensor, and wherein the controller circuit is configured to detect the fault arc based on the sensor data from the current sensor or the voltage sensor.

5. The electrical circuit of claim 1, wherein the at least one parameter comprises one or more of:
  a fault arc energy parameter indicative of energy of the fault arc;
  a fault arc duration parameter indicative of a duration of the fault arc;
  a fault arc power parameter indicative of a power of the fault arc;
  a fault arc resistance gradient indicative of a resistance gradient of the fault arc;
  a fault arc resistance parameter indicative of a resistance of the fault arc;
  a fault arc current parameter indicative of a current of the fault arc;
  a fault arc voltage gradient indicative of a voltage gradient of the fault arc; and
  a fault arc voltage parameter indicative of a voltage of the fault arc.

6. The electrical circuit of claim 1, wherein the controller circuit is configured to:
generate a notification based on the at least one parameter stored by the fault arc register.

7. The electrical circuit of claim 1, wherein the fault condition is a manifestation of an overcurrent condition, and to detect the fault condition the controller circuit is configured to:
retrieve a fault processing profile from a plurality of available fault processing profiles, the retrieved fault processing profile comprising a preconfigured current threshold level stored in at least a second register of the plurality of registers; and
determine a power load current between the contact and a power load is higher than the preconfigured current threshold level for a preconfigured time duration.

8. The electrical circuit of claim 7, wherein the preconfigured time duration is based on a type of load associated with the power load.

9. The electrical circuit of claim 7, wherein the fault condition is based on a charge amount associated with the power load current, and to detect the fault condition the controller circuit is configured to:
determine the charge amount is greater than a preconfigured charge threshold level stored in at least a third register of the plurality of registers.

10. e electrical circuit of claim 1, wherein the controller circuit is configured to:
generate an alert notification of the fault condition.

11. The electrical circuit of claim 10, wherein the alert notification is configured based on an alert notification parameter stored in an alert register of the plurality of registers.

12. An electrical circuit, comprising:
a contact with a pair of switchable electrodes, the contact configured to cycle through make and break transitions while conducting current;
an arc suppressor operatively coupled across the pair of switchable electrodes and configured to extinguish an arc formed across the pair of switchable electrodes during the make and break transitions of the contact;
a voltage sensor coupled to the pair of switchable electrodes, the voltage sensor configured to generate voltage sensor data of voltage across the pair of switchable electrodes;
a controller circuit operatively coupled to the voltage sensor, the arc suppressor, and the pair of switchable electrodes, the controller circuit comprising a plurality of registers and configured to detect a fault condition associated with the contact based on the voltage sensor data, and sequence contact opening of the contact with contact opening of at least a second contact based on the detected fault condition and a timing value associated with the fault condition and stored in at least one register of the plurality of registers wherein when the fault condition is based on a presence of a fault arc between the pair of switchable electrodes, the at least one register comprises a fault arc parameter register storing at least one parameter associated with the fault arc.

13. The electrical circuit of claim 12, wherein the controller circuit is configured to:
delay the contact opening of the at least second contact for a time delay corresponding to the timing value.

14. The electrical circuit of claim 12, wherein the controller circuit is configured to:
generate an alert notification of the fault condition.

15. The electrical circuit of claim 14, wherein the alert notification is configured based on an alert notification parameter stored in an alert register of the plurality of registers.

16. A method, comprising:
coupling a contact with a pair of switchable electrodes of a contact sequencer circuit, the contact configured to cycle through a make state and a break state while conducting current;
coupling an arc suppressor across the pair of switchable electrodes;
coupling at least one sensor coupled to the pair of switchable electrodes, the at least one sensor configured to generate sensor data;
coupling a controller circuit to the arc suppressor and the at least one sensor, the controller circuit configured to detect a fault condition based on the sensor data; and
sequencing contact opening of the contact based on the detected fault condition and a timing value associated with the fault condition and stored in at least one register of a plurality of registers of the controller circuit, wherein when the fault condition is based on a presence of a fault arc between the pair of switchable electrodes, the at least one register comprises a fault arc parameter register storing at least one parameter associated with the fault arc.

17. The method of claim 16, wherein the at least one register is a delay timing register, and the method further comprising:
retrieving the timing value from the delay timing register; and
configuring the contact to remain open for a time delay corresponding to the timing value.

18. The method of claim 17, further comprising:
performing contact opening of at least a second contact associated with the make and break transitions, after expiration of the time delay.

19. The method of claim 16, wherein the at least one sensor is a current sensor, and the method further comprising:
detecting a fault arc between the pair of switchable electrodes based on current data detected by the current sensor;
storing at least one parameter associated with the fault arc in a fault arc parameter register of the controller circuit; and
generating a notification based on the at least one parameter.

* * * * *